United States Patent
Kawase et al.

(10) Patent No.: US 7,481,515 B2
(45) Date of Patent: Jan. 27, 2009

(54) METHOD AND APPARATUS FOR PRODUCING COLOR FILTER, METHOD AND APPARATUS FOR MANUFACTURING LIQUID CRYSTAL DEVICE, METHOD AND APPARATUS FOR MANUFACTURING EL DEVICE, METHOD OF DISCHARGING MATERIAL, APPARATUS FOR CONTROLLING HEAD AND ELECTRONIC APPARATUS

(75) Inventors: Tomomi Kawase, Shiojiri (JP); Hisashi Aruga, Fujimi-machi (JP); Satoru Katagami, Hara-mura (JP); Masaharu Shimizu, Hara-mura (JP); Hiroshi Kiguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 904 days.

(21) Appl. No.: 10/898,285

(22) Filed: Jul. 26, 2004

(65) Prior Publication Data
US 2005/0003283 A1  Jan. 6, 2005

Related U.S. Application Data

(63) Continuation of application No. 10/020,244, filed on Dec. 18, 2001, now Pat. No. 6,783,208.

(30) Foreign Application Priority Data

Dec. 21, 2000 (JP) ............................ 2000-389320
Oct. 26, 2001 (JP) ............................ 2001-329823

(51) Int. Cl.
*B41J 2/15* (2006.01)

(52) U.S. Cl. .......................................... 347/41; 347/12
(58) Field of Classification Search ................. None
See application file for complete search history.

(56) References Cited

U.S. PATENT DOCUMENTS 6,277,529 B1    8/2001   Marumoto et al.
6,364,450 B1 *  4/2002   Yamaguchi et al. ........... 347/33

(Continued)

FOREIGN PATENT DOCUMENTS

EP          0829368 A       3/1998

(Continued)

*Primary Examiner*—Lamson D Nguyen
(74) *Attorney, Agent, or Firm*—Oliff & Berridge, PLC

(57) ABSTRACT

The invention makes uniform, in a plane, optical properties of optical members, such as the distribution properties of light transmission of a color filter, the color display properties of a liquid crystal device, and the light emission properties of an EL luminescent plane. During main scanning of color filter formation areas of a board in the X direction with an ink jet head having a nozzle row formed of a plurality of nozzles arranged in a row, a filter material is selectively discharged from the plurality of the nozzles to each of filer element areas arranged in a dot matrix to form filter elements, producing a color filter. First, the nozzle row is moved to positions "a" and "b" by main scanning in the X direction to enhance wettability of the surface of the areas and then main scanning is executed at each of the positions while successively moving the nozzle row to positions "c" through "k" by sub-scanning, thereby repeatedly discharging ink in the same portion of the areas.

17 Claims, 24 Drawing Sheets

U.S. PATENT DOCUMENTS

| | | | |
|---|---|---|---|
| 6,667,795 B2 * | 12/2003 | Shigemura | 349/187 |
| 6,783,208 B2 * | 8/2004 | Kawase et al. | 347/41 |
| 6,863,961 B2 | 3/2005 | Miyashita et al. | |

FOREIGN PATENT DOCUMENTS

| EP | 0 832 752 A2 | 4/1998 |
|---|---|---|
| EP | 0 984 303 A1 | 3/2000 |
| EP | 1208985 A | 5/2002 |
| JP | A-63-295270 | 12/1988 |
| JP | A-09-138306 | 5/1997 |
| JP | A-10-151755 | 6/1998 |
| JP | A-10-202851 | 8/1998 |
| JP | A-11-54270 | 2/1999 |
| JP | A-11-271753 | 10/1999 |
| JP | 2000-089017 A | 3/2000 |
| JP | A-2000-089020 | 3/2000 |
| JP | A-2000-147241 | 5/2000 |
| JP | A-2000-275425 | 10/2000 |
| JP | 2000-323276 A | 11/2000 |

* cited by examiner

FIG. 8 A
STRIPE 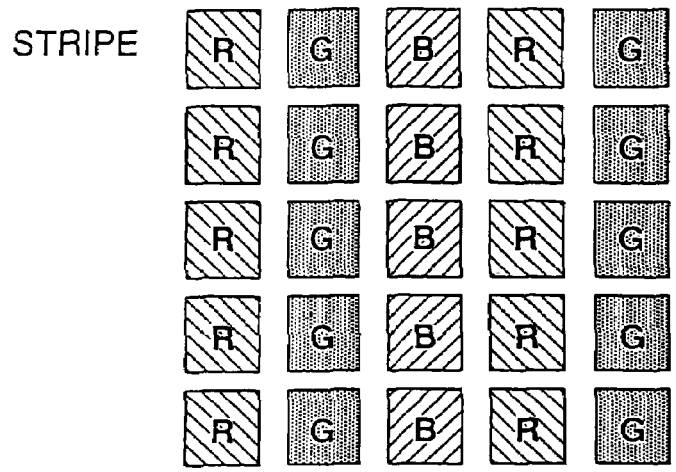
B
MOSAIC 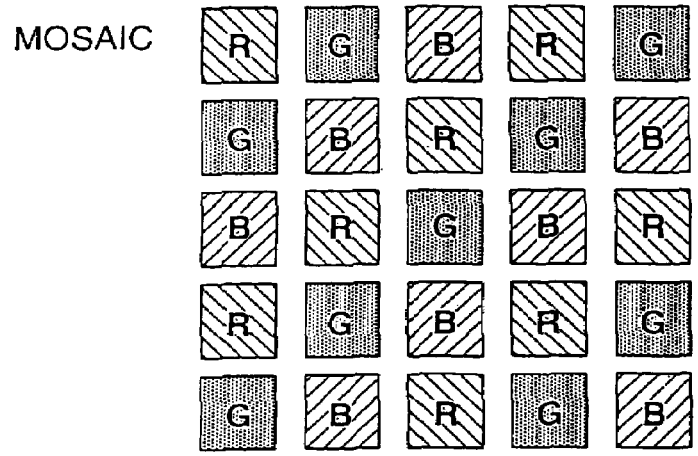
C
DELTA 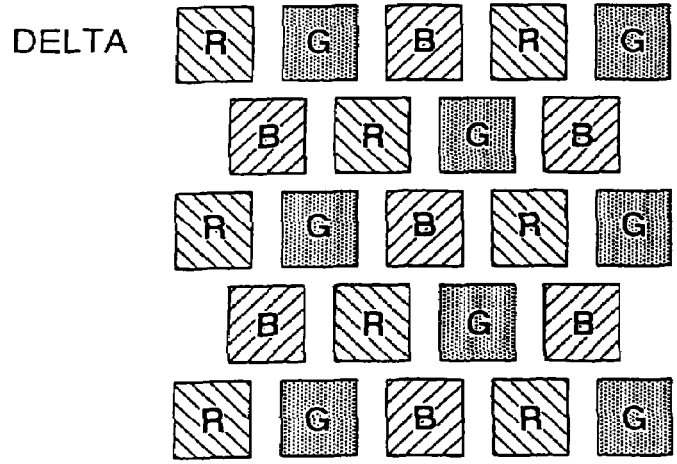

FIG. 13  A
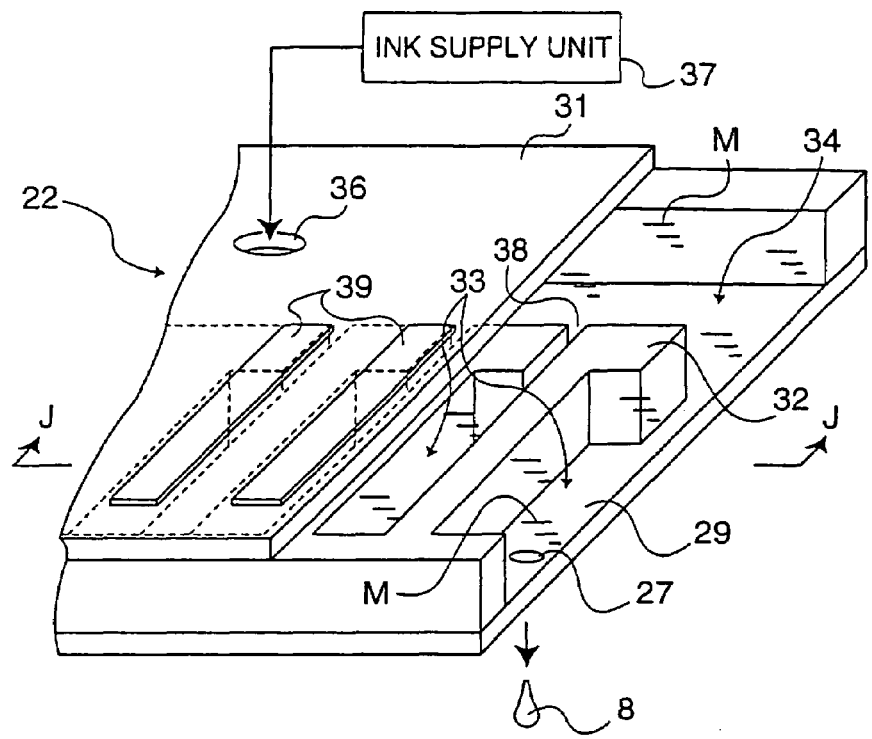
B
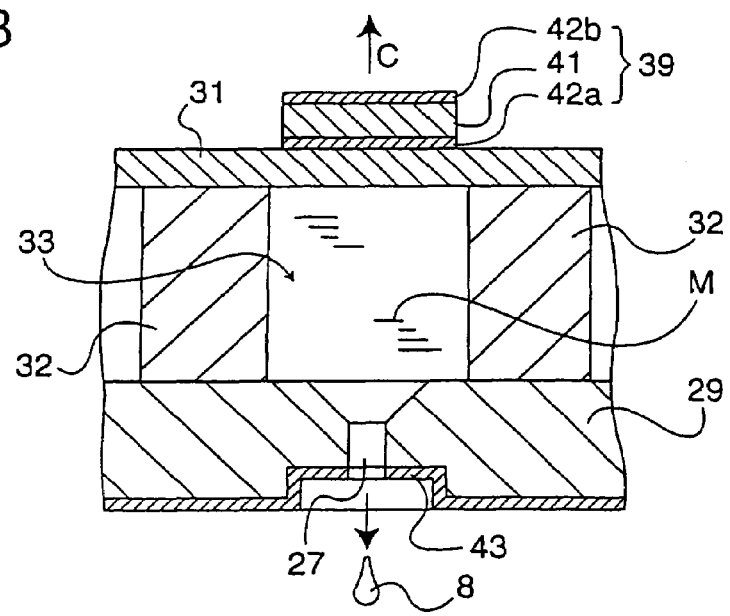

METHOD AND APPARATUS FOR PRODUCING COLOR FILTER, METHOD AND APPARATUS FOR MANUFACTURING LIQUID CRYSTAL DEVICE, METHOD AND APPARATUS FOR MANUFACTURING EL DEVICE, METHOD OF DISCHARGING MATERIAL, APPARATUS FOR CONTROLLING HEAD AND ELECTRONIC APPARATUS

This is a Continuation of application Ser. No. 10/020,244, filed Dec. 18, 2001. The entire disclosure of the prior application is hereby incorporated by reference herein in its entirety.

BACKGROUND OF THE INVENTION

1. Field of Invention

The present invention relates to a method and apparatus that produces a color filter used for optical devices, such as a liquid crystal device, and the like. The present invention also relates to a method and apparatus to manufacture a liquid crystal device having a color filter. The present invention further relates to a method and apparatus to manufacture an EL device that displays by using an EL luminescent layer. The present invention further relates to a method of discharging a material to an object, and an apparatus that controls a head. The present invention further relates to an electronic apparatus having a liquid crystal device or an EL device manufactured by the above-described method.

2. Description of Related Art

Recently, display devices, such as a liquid crystal device, an EL device, and the like have been widely used as display sections of electronic apparatuses, such as cell phones, portable computers, etc. Also, in recent years, full-color displays using a display device have been increasingly made. A full-color display of a liquid crystal device is made by, for example, transmitting light, which is modulated by a liquid crystal layer, through a color filter. The color filter includes dot-shaped color filter elements of R (red), G (green) and B (blue), which are formed in a predetermined arrangement such as a stripe, delta, or mosaic arrangement on the surface of a substrate of glass, plastic, or the like.

In a full-color display of an EL device, dot-shaped EL luminescent layers of R (red), G (green) and B (blue) colors are provided in a predetermined arrangement on electrodes, which are formed in any desired arrangement, for example, a stripe, delta, or mosaic arrangement, on the surface of a substrate made of, for example, glass, plastic, or the like. The voltage applied to these electrodes is controlled for each pixel to emit light of a desired color from each pixel, thereby performing a full-color display.

In the related art, it is known that a photolithography process is used to pattern the filter elements of each of the R, G, and B colors of the color filter, or to pattern the pixels of each of the R, G, and B colors of the EL device. However, the use of the photolithography process has complicates the process, and increases the cost due to the high consumption of each color material and photoresist, etc.

In order to solve the problems, a method has been proposed in which a filter material, an EL luminescent material, or the like is discharged in a dot shape to form a dot-arrangement filter element or EL luminescent layer, or the like.

Consideration will now be given to a case in which, as shown in FIG. 23(b), a plurality of dot-shaped filter elements 303 are formed by an ink jet method in each of a plurality of panel areas 302, which are set on the surface of a large-area substrate of glass, plastic, or the like, for example, a so-called motherboard 301 shown in FIG. 23(a).

In this case, during several times (twice in the case shown in FIG. 23) of main scanning with an ink jet head 306 having a nozzle row 305 including a plurality of nozzles 304 arranged in a row as shown in FIG. 23(c) for each panel area 302, as shown by arrows A1 and A2 in FIG. 23(b), a filter material, for example, ink, is selectively discharged from the plurality of nozzles to form the filter elements 303 at desired positions.

The filter elements 303 of each of the R, G, and B colors are formed in an appropriate arrangement such as a stripe, delta or mosaic arrangement. Therefore, for ink discharge from the ink jet head 306, the ink jet head 306 for discharging each of the R, G, and B colors is previously provided for each of the three colors R, G and B so that the ink jet heads 306 are successively used to form an arrangement of the three colors of R, G and B on the motherboard 301, as shown in FIG. 23(b).

SUMMARY OF THE INVENTION

The ink jet head 306 generally causes variations in the amounts of the ink discharged from the plurality of nozzles 304 which constitute the nozzle line 305. For example, the ink jet head 306 has such an ink discharge property Q that the discharge amounts at positions corresponding to both ends of the nozzle line 305 are large; the discharge amounts at intermediate positions between both ends and the center are small; the discharge amounts in the central portion of the nozzle line 305 are medium between both ends and the intermediate positions, as shown in FIG. 24(a).

Therefore, when the filter elements 303 are formed by the ink jet head 306 as shown in FIG. 23(b), dark stripes with a high density are formed at positions P1 corresponding to the ends of the ink jet head 306 or center P2, or both the positions P1 and the center P2, thereby causing nonuniformity in the planar light transmission property of the color filter, as shown in FIG. 24(b).

The present invention has been achieved in consideration of the above problem, and an object of the present invention is to provide a method and apparatus to produce each of optical members which are capable of making uniform in a plane the optical properties of an optical member, such as the distribution properties of light transmission of a color filter, the color display properties of a liquid crystal device, the luminescence properties of an EL luminescent plane, etc.

A method of producing a color filter of the present invention includes a first main scanning step of scanning, along a main scanning direction, one of a substrate and a head relative to the other, the head having a nozzle row including an arrangement of a plurality of nozzles, while discharging a filter material from the plurality of nozzles to the substrate, a second main scanning step of scanning one of the head and the substrate relative to the other along the main scanning direction while discharging a filter material to the substrate. In the second main scanning step, scanning is performed in such a manner that a portion of the crossing region of the nozzle row and the substrate overlaps with at least a portion the crossing region in the first main scanning step.

In the method of producing a color filter of the present invention, each of the filter elements of the color filter is formed to a predetermined thickness by repeatedly discharging ink from the plurality of nozzles, not by single scanning with the head. Therefore, even if there are variations in the amounts of the ink discharged from the plurality of nozzles, the occurrence of variations in thickness of the plurality of filter elements can be prevented, thereby making the distribution properties of light transmission of the color filter uniform in a plane.

Since the method of producing a color filter uses the head including the plurality of nozzles, of course, the method has no need to pass through such a complicated step as in a method including a photolithography process, and causes no waste of materials.

Also, in the method of producing a color filter, preferably, the first main scanning step is performed several times so that the crossing region of the nozzle row and the substrate in each performance of the main scanning step does not overlap with the crossing regions in the other performances of the main scanning steps. Namely, the entire surface of the substrate in a dry state can be set to a uniformly wet state with a uniform thickness before a filter material is repeatedly discharged several times to form the filter elements having the predetermined thickness, and thus marked boundaries can be prevented from remaining at the ink overlap boundaries in subsequent repeated coatings.

Not only the first main scanning step, but also the second main scanning step is performed several times so that the crossing region of the nozzle row and the substrate in each performance of the second main scanning step does not overlap with the crossing regions in the other times of the second main scanning steps.

In this method, each of the filter elements of the color filter is formed to a predetermined thickness by repeating several times the step of discharging the filter material to a uniform thickness on the surface of the substrate, not by single scanning with the head. Therefore, even if there are variations in the amounts of the ink discharged from the plurality of nozzles, the occurrence of variations in thickness of the plurality of filter elements can be prevented, thereby making the distribution properties of light transmission of the color filter uniform in a plane.

Furthermore, in this method, in the first performance of the main scanning step, i.e., in forming the filter material directly on the surface of the substrate, main scanning is performed to avoid overlapping of the nozzle row, and thus the filter material can be adhered in a uniform thickness to the entire surface of the substrate. Therefore, the entire surface of the substrate generally in a dry state can be set to a uniformly wet state with a uniform thickness, thereby preventing marked boundaries from remaining at the overlap boundaries of the filter material in subsequent repeated coatings.

The nozzle row is virtually divided into a plurality of groups, and in the second main scanning step, the crossing region of each of the groups and the substrate in the first main scanning step overlaps with the crossing region of at least one of the other groups and the substrate in the first main scanning step. The method of the present invention preferably further includes the sub-scanning step of scanning one of the head and the substrate relative to the other in a sub-scanning direction crossing the main scanning direction in such a manner that main scanning is repeated several times with sub-scanning movement by a length of an integral multiple of the length of each nozzle group in the sub-scanning direction. By using this construction, the plurality of the nozzle groups scan the same portion of the substrate to repeatedly supply the filter material to each of the filter element regions from the nozzles in each of the nozzle groups.

The nozzle row can be arranged at an angle with the sub-scanning direction. The nozzle row includes the plurality of the nozzles which are arranged in a row. In this case, when the nozzle row is arranged in parallel to the sub-scanning direction of the ink jet head, the distance between the adjacent filter elements formed by the filter element material discharged from the nozzles, i.e., the element pitch, equals to the nozzle pitch of the plurality of the nozzles of the nozzle row.

When the element pitch may be equal to the nozzle pitch, the nozzle row may be arranged in parallel to the sub-scanning direction. However, such a case is a rare case, and in many cases, the element pitch is generally different from the nozzle pitch. When the element pitch is different from the nozzle pitch, like in the above-described construction, the nozzle row is inclined from the sub-scanning direction so that the length of the nozzle pitch along the sub-scanning direction can be coincided with the element pitch. In this case, the position of each of the nozzles constituting the nozzle row is shifted forward or backward in the main scanning direction. However, ink droplets can be supplied to a desired position from each of the nozzles by shifting the timing of discharge of the filter material from each of the nozzles.

In the first and second methods of producing a color filter, the length of sub-scanning movement of the head can be determined as follows. Assuming that the length of the nozzle row is L, the number of the groups formed by dividing the nozzle row is n, and the angle formed by the nozzle row and the sub-scanning direction is θ, the length δ of sub-scanning movement is as follows:

$$\delta \approx \text{Integral multiple of } (L/n) \cos\theta.$$

In this construction, the plurality of the nozzles of the head can be moved for each nozzle group in the sub-scanning direction. As a result, for example, considering the case in which the nozzle row is divided into four nozzle groups, each region of the substrate is repeatedly scanned by the four nozzle groups.

In the first and second methods of producing a color filter, a control method can be used, in which the filter material is not discharged from the nozzles present at both ends of the nozzle row. As described above with reference to FIG. 24(a), in a general head, the ink discharge distribution of either end portion of the nozzle row is different from the other portions. In an ink jet head having such an ink discharge distribution, a plurality of nozzles having a uniform ink discharge distribution, except some nozzles in either end portion of the nozzle row, which have great change in the discharge distribution, are used to make the thickness of the filter elements uniform in a plane.

Furthermore, in processing without using the nozzles present at both ends of the nozzle row, as described above, the length of sub-scanning movement of the head can be determined as follows. Assuming that the length of the nozzle row except the end portions, where ink is not discharged from the nozzles, is L, the number of the groups formed by dividing the nozzle row is n, and the angle formed by the nozzle row and the sub-scanning direction is θ, the length δ of sub-scanning movement can be determined as follows:

$$\delta \approx \text{Integral multiple of } (L/n) \cos\theta.$$

The color filter produced by each of the first and second methods of producing a color filter generally includes the filter elements of plural colors including R (red), G (green), and B (blue), or C (cyan), M (magenta), and Y (yellow), which are arranged in an appropriate planar pattern. In producing the color filter that has such filter elements having plural colors, the first or second main scanning step is performed by using a plurality of the heads so that the filter materials discharged from the plurality of the heads have different colors, the first or second main scanning step being performed for each head.

In another embodiment of the method of producing a color filter having filter elements having plural colors, a head may be provided with a plurality of nozzle rows so that the nozzle rows discharge filter materials of different colors.

An apparatus to produce a color filter by arranging filter elements on a substrate according to the present invention includes a head including a nozzle row having a plurality of nozzles arranged in a row, first main scanning device to scan one of the head and the substrate relative to the other in a main scanning direction, and second main scanning device to scan one of the head and the substrate relative to the other along the main scanning direction, wherein the second main scanning device performs main scanning in such a manner that a portion of the crossing region of the nozzle row and the substrate in first main scanning overlaps with at least a portion of the crossing region in first main scanning.

The apparatus to produce a color filter preferably includes an ink supply device that supplies a filter material to the head, a sub-scanning device that moves the head in the sub-scanning direction crossing the main scanning direction, and a nozzle discharge control device to control ink discharge from the nozzle.

A method of manufacturing a liquid crystal device having a color filter formed on one of a pair of substrates, which hold a liquid crystal therebetween, according to the present invention includes the step of forming the color filter on the substrate by any one of the above-described methods of producing a color filter.

An apparatus for manufacturing a liquid crystal device of the present invention includes the above-described apparatus for producing a color filter as a component, particularly, a mechanism that produces a color filter.

A method of manufacturing an EL device of the present invention is described below. An EL device generally includes EL luminescent layers which are arranged in a dot arrangement on a substrate, and can thus be manufactured by the same as the above-described method of producing a color filter. Namely, the method of manufacturing an EL device of the present invention uses an EL luminescent material in place of the filter material used in the method of producing a color filter.

An apparatus to manufacture an EL device of the present invention can also be realized in the same manner as the apparatus that produces a color filter. In this case, of course, the material discharged from a head is the EL luminescent material.

Besides the color filter, the liquid crystal device, and the EL device, the present invention can also be applied to various industrial technical fields by appropriately changing a discharged material and a discharge object.

The liquid crystal device and the EL device manufactured by the method of manufacturing a liquid crystal device and the method of manufacturing an EL device of the present invention can be mainly used as display sections, and particularly used for electronic apparatuses such as personal computers, cell phones, portable information devices, etc.

A method of discharging a material of the present invention is a technique which can be used in a wide industrial application field, and an electronic component produced by using this method as a production step can also be used for electronic apparatuses, such as personal computers, cell phones, portable information devices, etc.

BRIEF DESCRIPTION OF THE DRAWINGS

FIGS. 8($a$)-8($c$) are schematics showing examples of arrangement of picture element pixels of the three colors R, G and B in a color filter;

FIGS. 13($a$)-13($b$) are schematics showing the internal structure of an ink jet head, in which FIG. 13($a$) is a partially cut-away perspective view, and FIG. 13($b$) is a sectional view taken along plane J-J in FIG. 13($a$);

DETAILED DESCRIPTION OF PREFERRED EMBODIMENTS

First Embodiment

Figure 6:
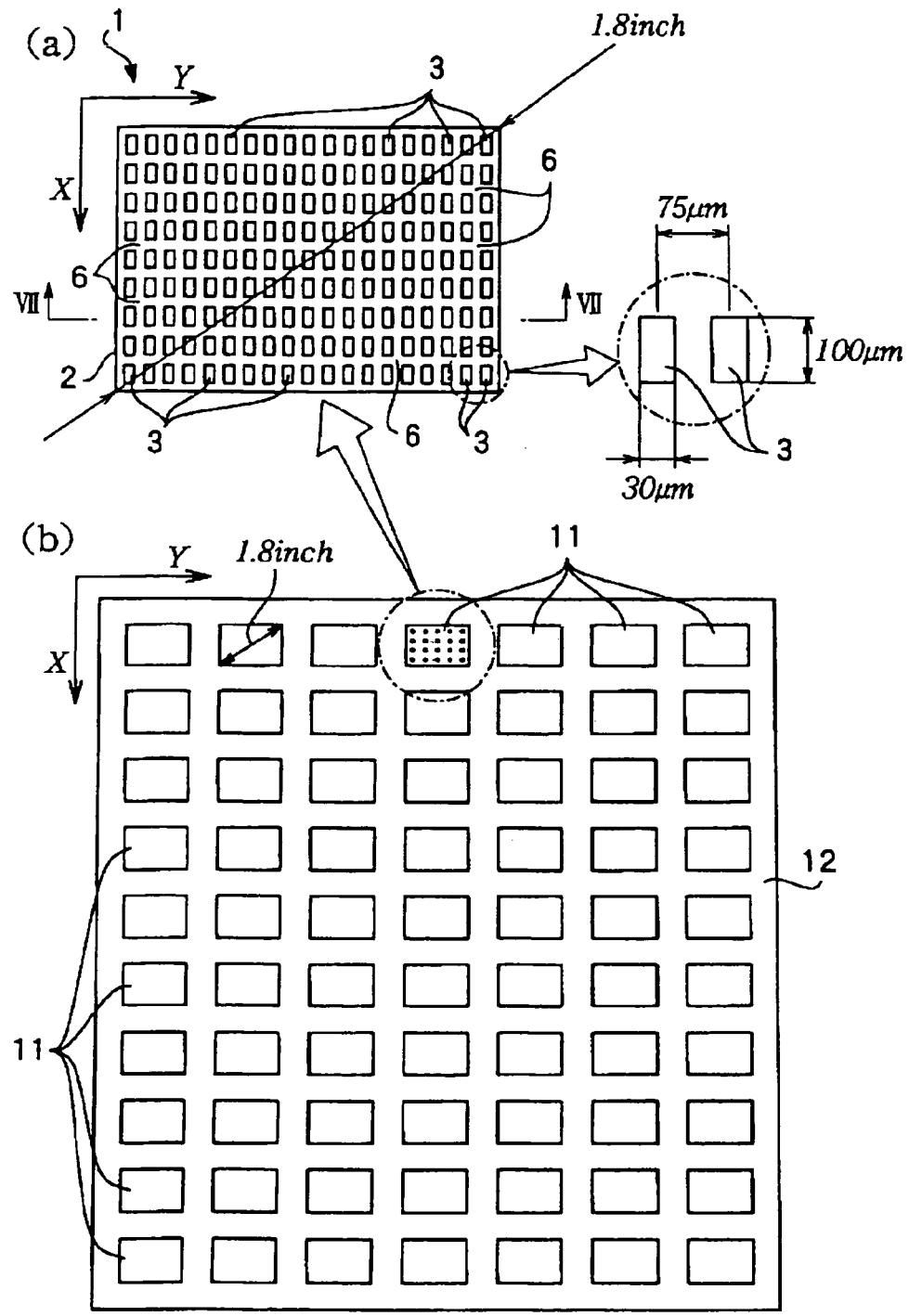
FIG. 6($a$) is a plan view showing a color filter according to an embodiment of the present invention, and FIG. 6($b$) is a plan view showing a motherboard serving as a base of the color filter according to an embodiment of the present invention.

A method and apparatus to produce a color filter according to an embodiment of the present invention will be described below. Before the production method and apparatus are described, a color filter produced by the production method is described. FIG. 6(a) schematically shows the planar structure of a color filter according to an embodiment. FIG. 7(d) shows a sectional structure taken along line VII-VII in FIG. 6(a).

The color filter 1 of this embodiment has a plurality of filter elements 3 which are formed in a dot pattern, which is in this embodiment, a dot matrix, on a surface of a rectangular substrate 2 made of glass, plastic, or the like, and a protecting film 4 laminated on the filter elements 3 as shown in FIG. 7(d). FIG. 6(a) is a plan view of the color filter 1 with the protecting film 4 being removed.

The filter elements 3 are formed by filling colorants in a plurality of rectangular regions, which are arranged in a dot matrix and are divided by a partition 6 made of a non-transmissive resin material and formed in a lattice pattern. Each of the filter elements 3 is made of any one of colorants of R (red), G (green) and B (blue), and the filter elements 3 of each color are arranged in a predetermined pattern. As the arrangement, for example, the stripe arrangement show in FIG. 8(a), the mosaic arrangement shown in FIG. 8(b), and the delta arrangement shown in FIG. 8(c) are known.

In the stripe arrangement, all filter elements in each column of a matrix are the same color. In the mosaic arrangement, any three filter elements arranged in vertical and horizontal lines are respectively R (red), G (green) and B (blue). In the delta arrangement, the filter elements are arranged to be staggered so that any three adjacent filter elements are, respectively, the three colors of R, G and B.

Although, in this embodiment, the three colors of R (red), G (green) and B (blue) are used, of course, a combination of C (cyan), M (magenta) and Y (yellow) can also be used.

The size of the color filter 1 is, for example, 1.8 inches. The size of each of the filter elements 3 is, for example, 30 μm×100 μm. The distance between the respective filter elements 3, i.e., the element pitch, is 75 μm, for example.

When the color filter 1 of this embodiment is used as an optical element for a full-color display, the three filter elements 3 of the R, G, and B colors are combined as a unit to form a pixel, and light is selectively transmitted through any one of R, G and B or a combination thereof in each pixel to perform a full-color display. In this case, the partition 6 made of a non-transmissive resin material functions as a black matrix.

The color filter 1 is cut out of a large-area motherboard 12, for example, as shown in FIG. 6(b). Specifically, a patter for one color filter is formed on the surface of each of a plurality of color filter formation areas 11 set in the motherboard 12, cutting grooves are formed around the color filter formation areas 11, and then the motherboard 12 is cut along the grooves to form the respective color filters 1.

The method and apparatus to produce the color filter 1 shown in FIG. 6(a) will be described below.

Figure 7:
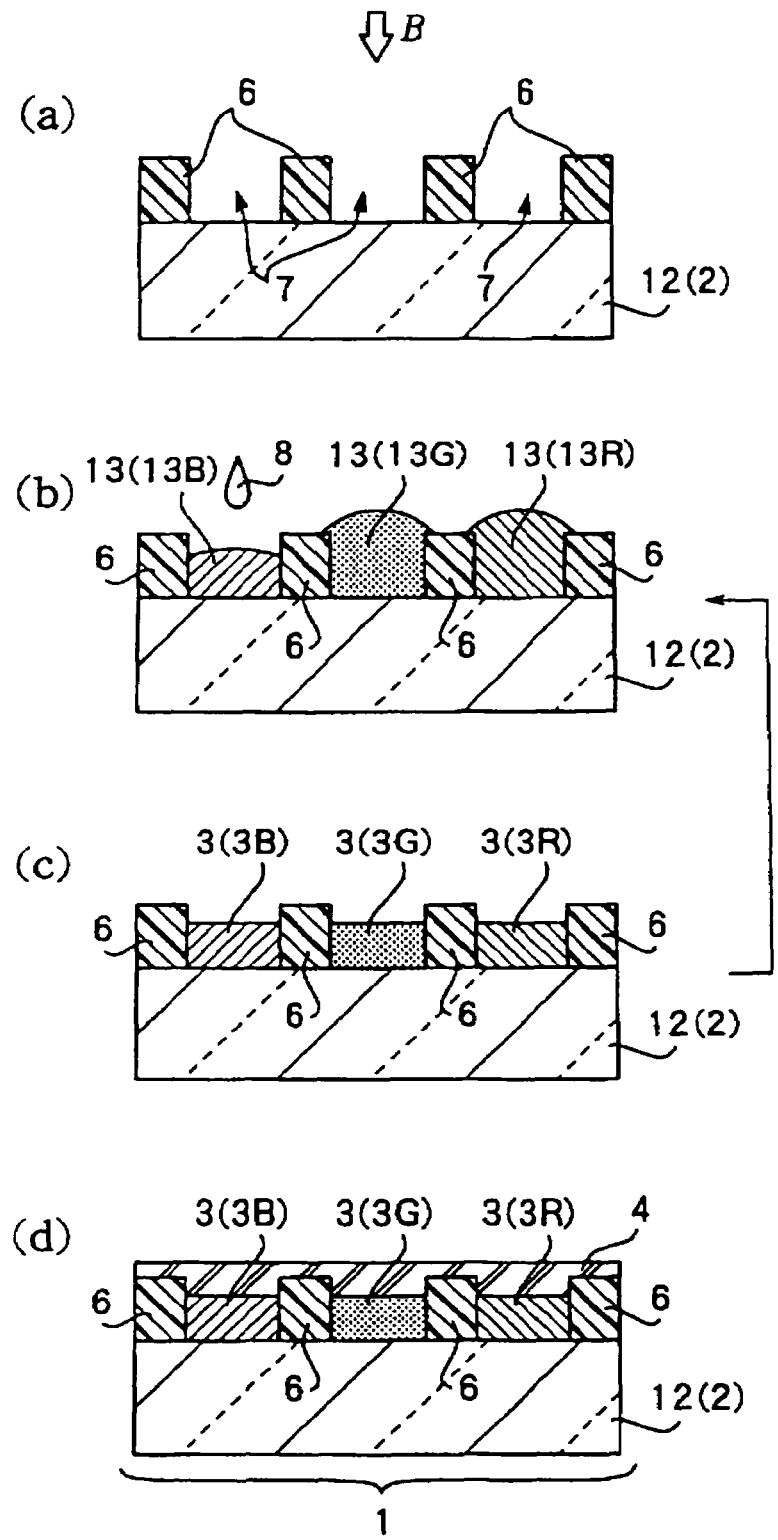
FIGS. 7($a$)-7($d$) are sectional views schematically showing the steps for producing a color filter, taken along plane VII-VII in FIG. 6($a$)

FIG. 7 schematically shows the steps of the method of producing the color filter 1 in order. First, the partition 6 made of a non-transmissive resin material is formed in a lattice pattern on the surface of the motherboard 12, as viewed from the direction show by arrow B. The lattice holes 7 of the lattice pattern are areas in which the filter elements 3 are formed, i.e., the filter element areas. Each of the filter element areas 7 formed by the partition 6 has planar dimensions of, for example, about 30 μm×100 μm, as viewed from the direction of arrow B.

The partition 6 has the function to prohibit a flow of a filter element material supplied to the filter element areas 7, and the function as the black matrix. The partition 6 is formed by any desired patterning method, for example, a photolithography method, and is further heated by a heater according to demand.

After the partition 6 is formed, droplets 8 of a filter element material are supplied to each of the filter element areas 7 to fill each of the filter element areas 7 with a filter element material 13, as shown in FIG. 7(b). In FIG. 7(b), reference numeral 13R denotes the filter element material having R (red) color, reference numeral 13G denotes the filter element material having G (green) color, and reference numeral 13B denotes the filter element material having B (blue) color.

After a predetermined amount of the filter element material 13 is supplied to each of the filter element areas 7, the motherboard 12 is heated to about 70° C. by the heater to evaporate the solvent of the filter element materials. The evaporation decreases the volume of the filter element materials 13, as shown in FIG. 7(c). When the volume is extremely decreased, droplets of the filter element materials 13 are supplied and heated repeatedly until the color filter has a sufficient thickness. By the above-described process, only the solid contents of the filter element materials 13 finally remain to form films, thereby forming the filter elements 3 of each of the desired colors.

After the filter elements 3 are formed as described above, heating is carried out at a predetermined temperature for a predetermined time in order to completely dry the filter elements 3. Then, the protecting film 4 is formed by using an appropriate method, for example, a spin coating method, a roll coating method, a dipping method, or the like. The protecting film 4 is formed that protects the filter elements 3 and that planarizes the surface of the color filter 1.

Figure 9:
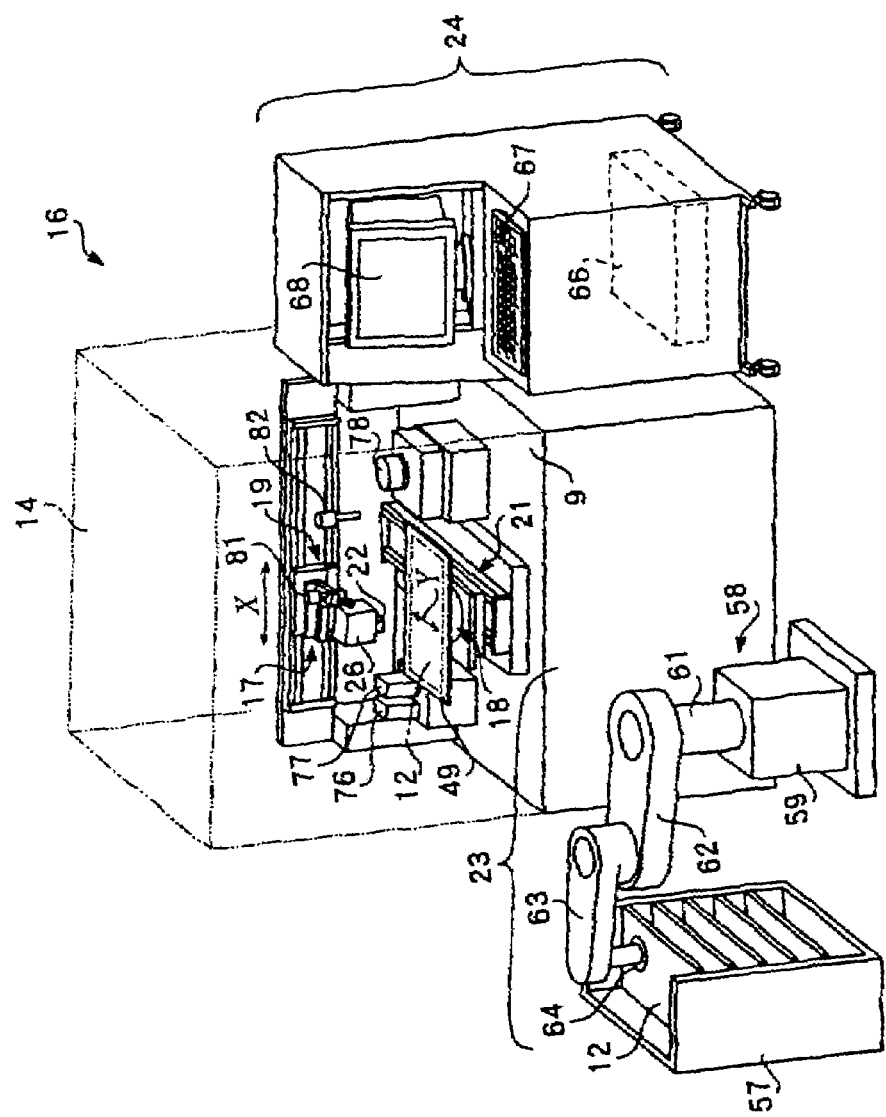
FIG. 9 is a perspective view showing an ink jet apparatus according to an embodiment of the present invention, which is a significant component of various manufacturing apparatuses, such as an apparatus for producing a color filter of the present invention, an apparatus for manufacturing a liquid crystal device of the present invention, and an apparatus for manufacturing an EL device of the present invention.

FIG. 9 shows an ink jet apparatus that supplies the filter element materials shown in FIG. 7(b) in accordance with an embodiment. The ink jet apparatus 16 is an apparatus for discharging and adhering the filter element material of one of the colors R, G and B, for example, R color, as ink droplets to a predetermined position in each of the color filter formation areas 11 of the motherboard 12 (refer to FIG. 6(b)). Although an ink jet apparatus is prepared for the filter element materials of each of the G and B colors, these ink jet apparatuses are not described below because the structures thereof are the same as FIG. 9.

In FIG. 9, the ink jet apparatus 16 includes a head unit 26 having an ink jet head 22, a head position control device 17 that controls the position of the ink jet head 22, a board position control device 18 that controls the position of the motherboard 12, a main scanning driving device 19 that moves the ink jet head 22 relative to the motherboard 12 by main scanning, a sub-scanning driving device 21 that moves the ink jet head 22 relative to the motherboard 12 by sub-scanning, a board feeder 23 for feeding the motherboard 12 to a predetermined working position in the ink jet apparatus 16, and a control device 24 that controls the entirety of the ink jet apparatus 16.

The head position control device 17, the board position control device 18, the main scanning driving device 19 and the sub-scanning driving device 21 are provided on a base 9. These devices are covered with a cover 14 according to demand.

Figure 11:
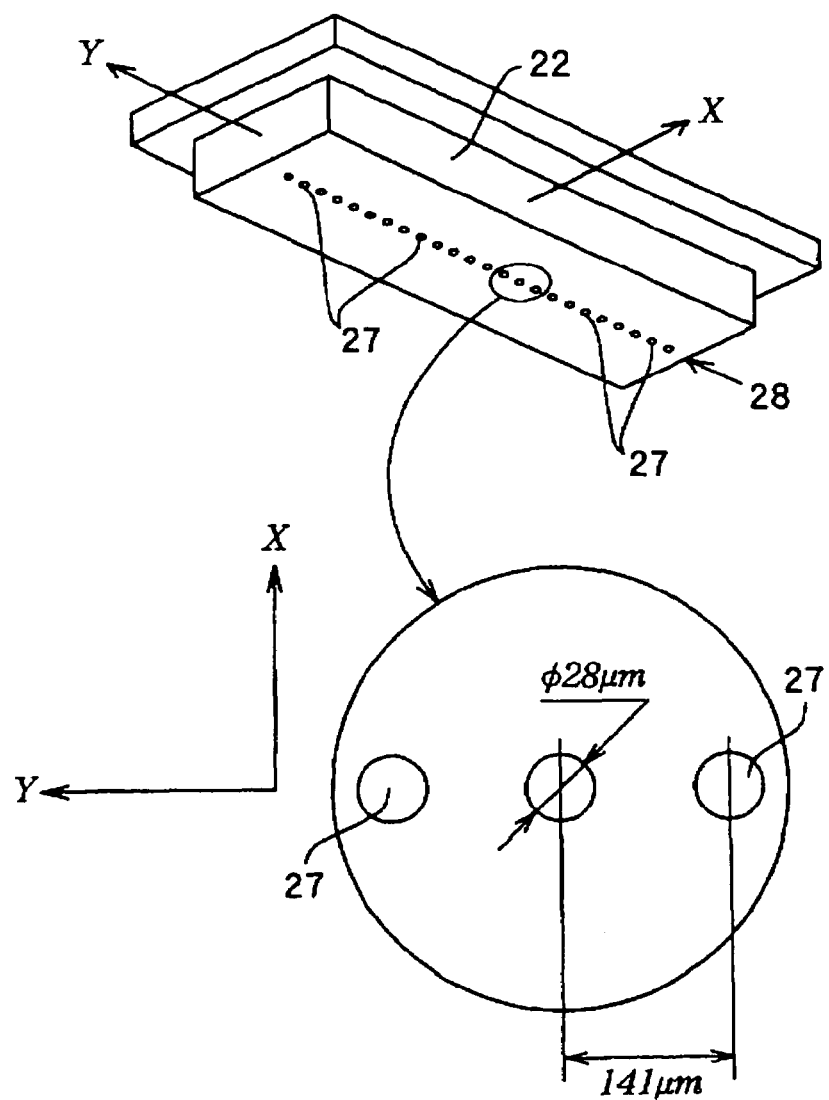
FIG. 11 is an enlarged perspective view showing an ink jet head as a main unit of the apparatus shown in FIG. 10.

The ink jet head 22 has a nozzle row 28 having a plurality of nozzles 27 arranged in a row, for example, as shown in FIG. 11. The number of the nozzles 27 is, for example, 180, and the hole diameter of the nozzles 27 is, for example, 28 μm. The nozzle pitch of the nozzles 27 is, for example, 141 μm. In FIGS. 6(a) and 6(b), the main scanning direction X of the motherboard 12, and the sub-scanning direction Y perpendicular to the main scanning direction X are set as shown in FIG. 11.

The position of the ink jet head 22 is set so that the nozzle row 28 extends in a direction crossing the main scanning direction X. During movement in parallel to the main scanning direction X, the filter element material as an ink is selectively discharged from the plurality of nozzles 27 to adhere the filter element material at predetermined positions in the motherboard 12 (refer to FIG. 6(b)). The ink jet head 22 can be moved by a predetermined distance in parallel to the sub-scanning direction to shift the main scanning position of the ink jet head 22 by the predetermined distance.

The ink jet head 22 has an internal structure, for example, shown in FIGS. 13(a) and 13(b). Specifically, the ink jet head 22 includes a stainless steel nozzle plate 29, a vibrating plate 31 opposed to the nozzle plate 29, and a plurality of partition members 32 that connect the nozzle plate 29 and the vibrating plate 31. The partition members 32 form a plurality of ink chambers 33 and a liquid reservoir 34 between the nozzle plate 29 and the vibrating plate 31.

The plurality of the ink chambers 33 communicate with the liquid reservoir 34 through passages 38.

Also, an ink supply hole 36 is formed at a proper position of the vibrating plate 31, and an ink supply device 37 is connected to the ink supply hole 36. The ink supply device 37 supplies the filter element material M of one of the R, G and B colors, for example, R color, to the ink supply hole 36. The supplied filter element material M is stored in the liquid reservoir 34, and is further passed through the passages 38 to fill the ink chambers 33.

The nozzle plate 29 has nozzles 27 that jet the filter element material M from the ink chamber 33. Furthermore, ink pressing members 39 are provided on the back of the vibrating plate 31, which is opposite to the side forming the ink chambers 33, corresponding to the ink chambers 33. Each of the ink pressing members 39 includes a piezoelectric element 41, and a pair of electrodes 42a and 42b which hold the piezoelectric element 41 in between, as shown in FIG. 13(b). The piezoelectric element 41 is deformed to project outward by electricity supplied to the electrodes 42a and 42b, as shown by an arrow C, increasing the volume of the corresponding ink chamber 33. As a result, an amount of the filter element material M corresponding to the increase in volume flows into the ink chamber 33 from the liquid reservoir 34 through the passage 38.

When electrification of the piezoelectric element 41 is stopped, both the piezoelectric element 41 and the vibrating plate 31 return to the initial shapes. As a result, the ink chamber 33 also returns to the initial volume to increase the pressure of the filter element material M in the ink chamber 33, thereby ejecting the filter element M as droplets 8 to the motherboard 12 (refer to FIG. 6(b)) from the nozzle 27. In addition, an ink repellent layer 43 having, for example, a Ni-tetrafluoroethylene eutectoid plated layer, is provided around the nozzle 27, to prevent an arcing out of the droplets 8 and/or clogging of the nozzle 27, etc.

Figure 10:
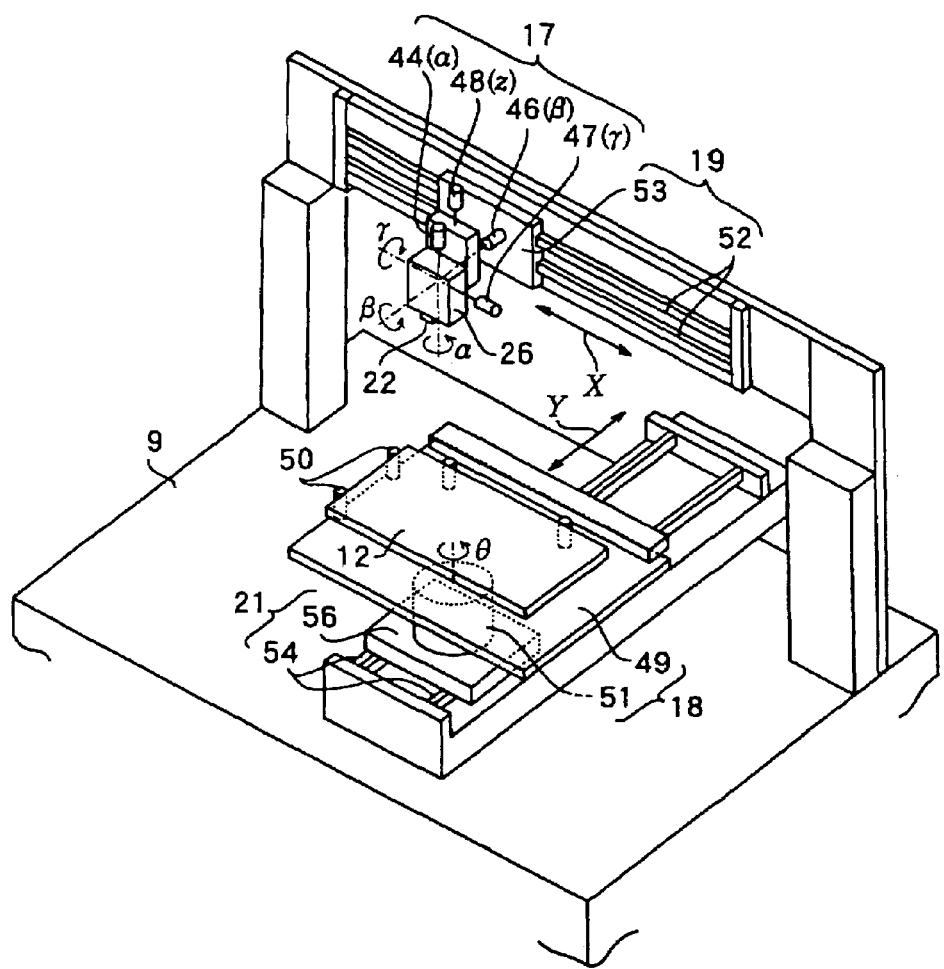
FIG. 10 is an enlarged perspective view showing a main portion of the apparatus shown in FIG. 9.

In FIG. 10, the head position control device 17 has a α motor 44 to rotate the ink jet head 22 in a plane, a β motor 46 that oscillates and rotates the ink jet head 22 around an axis parallel to the sub-scanning line Y, a γ motor 47 that oscillates and rotates the ink jet head 22 around an axis parallel to the main scanning line X, and a Z motor 48 for moving the ink jet head 22 in parallel to the vertical direction.

In FIG. 10, the board position control device 18 shown in FIG. 9 has a table 49 on which the motherboard 12 is mounted, and a θ motor 51 that rotates the table 49 in a plane as shown by arrow θ. The main scanning driving device 19 shown in FIG. 9 includes a guide rail 52, extending in the main scanning direction X, and a slider 53 containing a pulse-driven linear motor. When the linear motor is operated, the slider 53 is moved in parallel to the main scanning direction along the guide rail 52.

In FIG. 10, the sub-scanning driving device 21 shown in FIG. 9 includes a guide rail 54, extending in the sub-scanning direction Y, and a slider 56 containing a pulse-driven linear motor. When the linear motor is operated, the slider 56 is moved in parallel to the sub-scanning direction Y along the guide rail 54.

The linear motor contained in each of the slider 53 and the slider 56 can precisely control the rotational angle of the output shaft by a pulse signal supplied to the motor, thereby precisely controlling the position of the ink jet head 22 supported by the slider 53 on the main scanning direction X, the position of the table 49 on the sub-scanning direction, and the like.

The position control of the ink jet head 22 and the table 49 is not limited to the method using a pulse motor, and the position control can also be realized by a feedback control method using a servo motor, or any other control method.

The board supply device 23, shown in FIG. 9, includes a board receiving unit 57 that receives the motherboard 12, and a robot 58 that transfers the motherboard 12. The robot 58 has a base 59 installed on an installation plane such as a floor, the ground, or the like, an elevating shaft 61 which moves up and down relative to the base 59, a first arm 62 rotating around the elevating shaft 61, a second arm 63 rotating relative to the first arm 62, a suction pad 64 provided at the bottom of the tip of the second arm 63. The suction pad 64 can attract the motherboard 12 by air suction, or the like.

In FIG. 9, a capping device 76 and a cleaning device 77 are disposed on one side of the sub-scanning driving device 21 in the locus of the ink jet head 22 driven by the main scanning driving device 19 that main scans. Also, an electronic balance 78 is disposed on the other side. The cleaning device 77 is a device that cleans the ink jet head 22. The electronic balance 78 is a device that measures the weight of the ink droplets discharged from each of the nozzles 27 (refer to FIG. 11) of the ink jet head 22. The capping device 76 is a device that prevents the nozzles 27 (refer to FIG. 11) from being dried when the ink jet head 22 is in a standby state.

Furthermore, a head camera 81 is disposed near the ink jet head 22 so as to move together with the ink jet head 22. A board camera 82 supported by a supporting device (not shown in the drawing) and provided on the base 9 is disposed at a position where the motherboard 12 can be photographed.

The control device 24 shown in FIG. 9 has computer body 66 containing a processor, a keyboard 67 serving as an input device, and a CRT (Cathode Ray Tube) display 68 serving as a display device. The processor includes a CPU (Central Processing Unit) 69 that arithmetic processes, and a memory, and/or, an information storage medium 71, that stores various items of information (as shown in FIG. 15).

Figure 15:
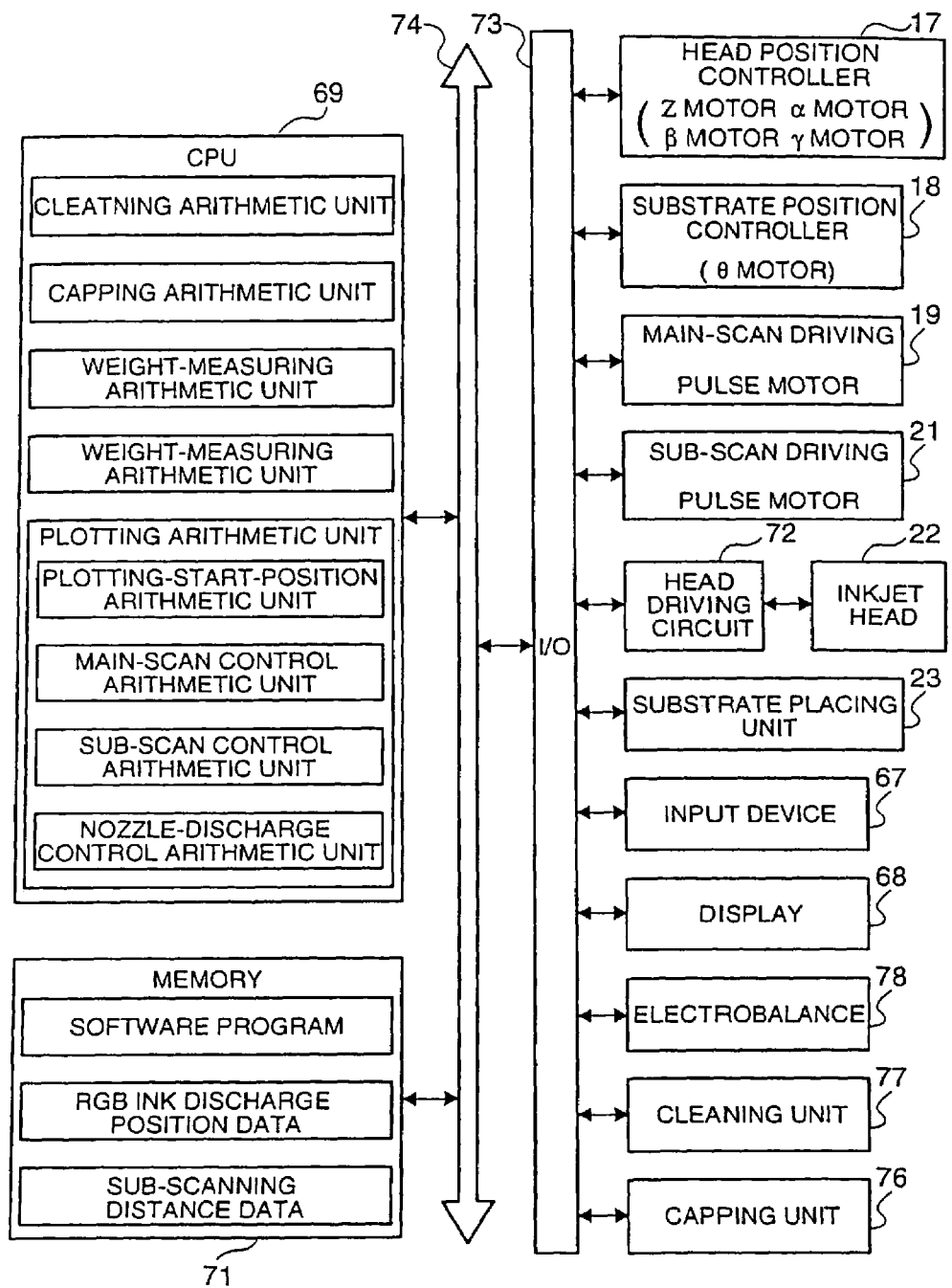
FIG. 15 is a block diagram showing en electric control system used in the ink jet head apparatus shown in FIG. 9.

The head position control device 17, the board position control device 18, the main scanning driving device 19, the sub-scanning driving device 21, and a head driving circuit 72 that drives the piezoelectric elements 41 (refer to FIG. 13(b)) in the ink jet head 22 are connected to the CPU 69 through an input/output interface 73 and a bus 74, as shown in FIG. 15. The board supply device 23, the input device 67, the display 68, the electronic balance 78, the cleaning device 77 and the capping device 76 are also connected to the CPU 69 through the input/output interface 73 and the bus 74.

The memory 71 is a concept including semiconductor memory such as RAM (Random Access Memory), ROM (Read Only Memory), and the like; and external storage devices, such as a hard disk, a CD-ROM reader, a disk-type storage medium, and the like. Functionally, there are a set storage area that stores a program software in which the control procedure for operation of the ink jet apparatus 16, a storage area that stores, as coordinate data, the discharge positions of one (for example, R color) of R, G and B in the motherboard 12 in order to realize the various RGB arrangements shown in FIG. 8, a storage area that stores the amount of sub-scanning movement of the motherboard 12 in the sub-scanning direction Y in FIG. 10, areas functioning as a work area and a temporary file for the CPU 69, and various other storage areas.

The CPU 69 controls the discharge of ink, i.e., the filter element material, at predetermined positions on the surface of the motherboard 12 according to the program software stored in the memory 71. The CPU 69 also controls the specific function realizing units and includes a cleaning operation unit that executes an arithmetic operation that realizes a cleaning process, a capping operation unit that realizes a capping process, a weight measurement operation unit that executes an arithmetic operation that realizes weight measurement using the electronic balance 78 (refer to FIG. 9), and a drawing operation unit that executes an arithmetic operation that draws a pattern of the filter element material by ink jet.

More specifically, the drawing operation unit is divided into various functional operation units such as a drawing start position operation unit that sets the ink jet head 22 at the initial position to draw, and the main scanning control operation unit that executes an arithmetic operation of control to move the ink jet head 22 in the main scanning direction X at a predetermined speed. Functional operation units also include a sub-scanning control operation unit to execute an arithmetic operation of control to shift the ink jet head 22 in the sub-scanning direction Y by a predetermined amount of sub-scanning, and a nozzle discharge control operation unit to execute an arithmetic operation of control that determines which nozzle of the plurality of nozzles of the ink jet head 22 is operated to discharge ink, i.e., the filter element material, etc.

In this embodiment, each of the above-descried functions is realized by using the CPU 69 based on the software. However, when each of the functions can be realized by a single electronic circuit without using the CPU, such an electronic circuit can be used.

The operation of the ink jet apparatus 16 having the above-described configuration will be described below based on the flowchart shown in FIG. 16.

When an operator turns on a power supply to start the ink jet apparatus 16, an initial setting is first executed in Step S1. Specifically, the head unit 26, the board supply device 23, the control device 24, and the like are set in the predetermined initial state.

Next, when a weight measurement time comes ("YES" in Step 2), the head unit 26 is moved to the electronic balance 78, shown in FIG. 9, by the main scanning driving device 19 (Step S3) to measure the weight of the ink discharged from each of the nozzles 27 by using the electronic balance 78 (Step S4). Therefore, the voltage applied to the piezoelectric element 41 corresponding to each of the nozzles 27 is controlled according to the ink discharge properties of the nozzles 27 (Step S5).

Next, when a cleaning time comes ("YES" in Step S6), the head unit 26 is moved to the cleaning device 77 by the main scanning driving device 19 (Step S7) to clean the ink jet head 22 by the cleaning device 77 (Step S8).

When the weight measurement time and the cleaning time do not come ("NO" in Steps S2 and S6), or when these processes are finished, the board supply device 23 shown in FIG. 9 is operated to supply the motherboard 12 to the table 49 in Step S9. Specifically, the motherboard 12 received in the board receiving unit 57 is suctionally held by the suction pad 64, and then the elevating shaft 61, the first arm 62 and the second arm 63 are moved to transfer the motherboard 12 to the table 49. Furthermore, the motherboard 12 is pressed on positioning pins (refer to FIG. 10) provided at proper positions of the table 49. In order to prevent a positional deviation of the motherboard 12 on the table 49, the motherboard 12 is preferably fixed to the table 49 by an air suction device or the like.

Next, the output shaft of the motor 51 shown in FIG. 10 is rotated by a small angular unit to rotate the table 49 by a small angular unit in a plane and position the motherboard 12 while observing the motherboard 12 with the board camera 82 shown in FIG. 9 (Step S10). Next, the start position of drawing by the ink jet head 22 is determined by an arithmetic operation while observing the motherboard 12 by the head camera 81 shown in FIG. 9 (Step S11), and then the main scanning driving device 19 and the sub-scanning driving device 21 are appropriately operated to move the ink jet head 22 to the drawing start position (Step S12).

Figure 1:
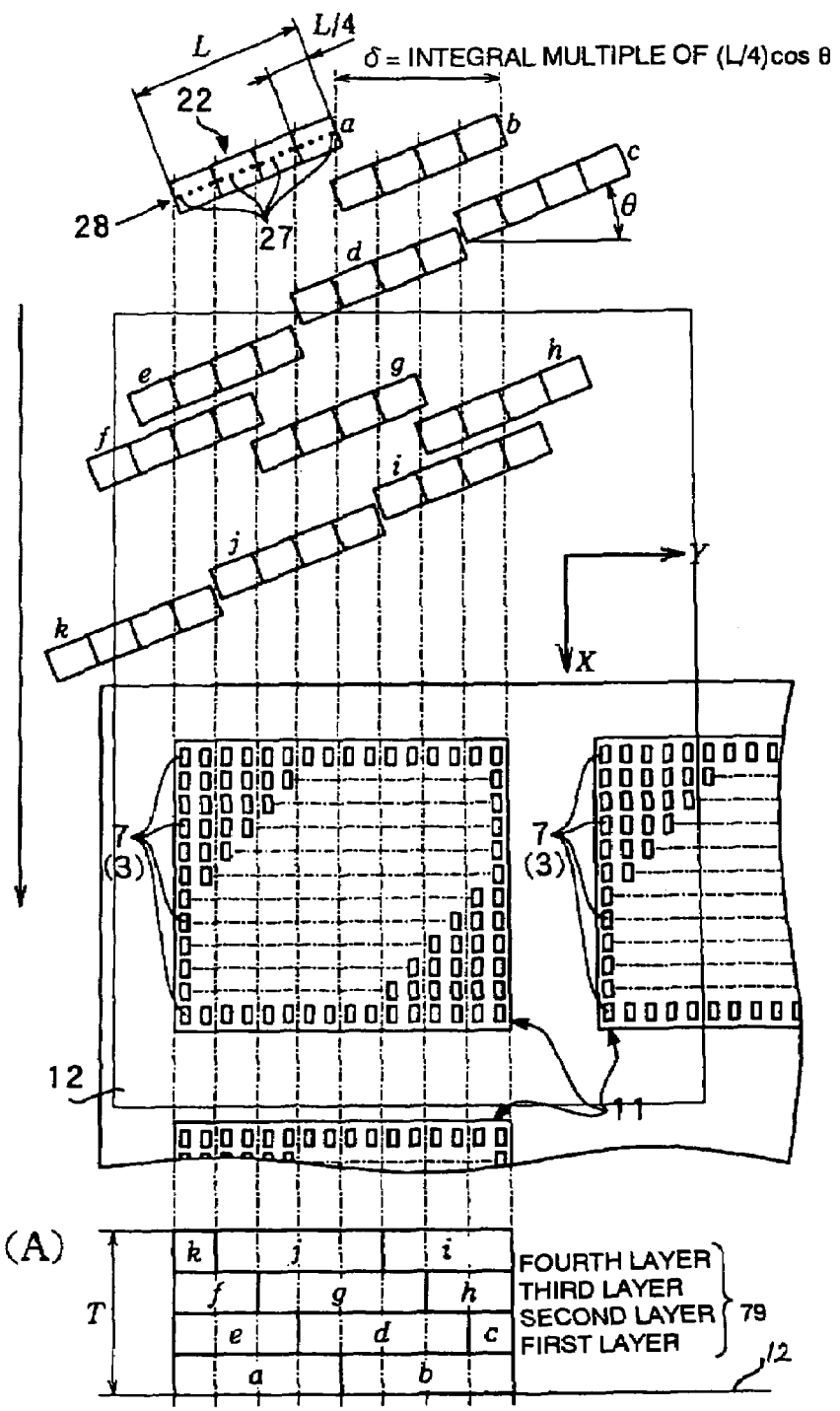
FIG. 1 is a plan view schematically showing a main step of a method of producing a color filter according to an embodiment of the present invention.

At the same time, the ink jet head 22 is set so that the nozzle row 28 is inclined at an angle θ to the sub-scanning direction Y of the ink jet head 22, as shown by position (a) in FIG. 1. This is a method for geometrically coinciding the dimensional component of the nozzle pitch in the sub-scanning direction Y with the element pitch when the ink jet head 22 is moved in the main scanning direction X. This is because, in a general ink jet apparatus, the nozzle pitch corresponding to the distance between the adjacent nozzles 27 is frequently different from the element pitch corresponding to the distance between the adjacent filter elements 3, i.e., the adjacent filter element formation areas 7.

Figure 16:
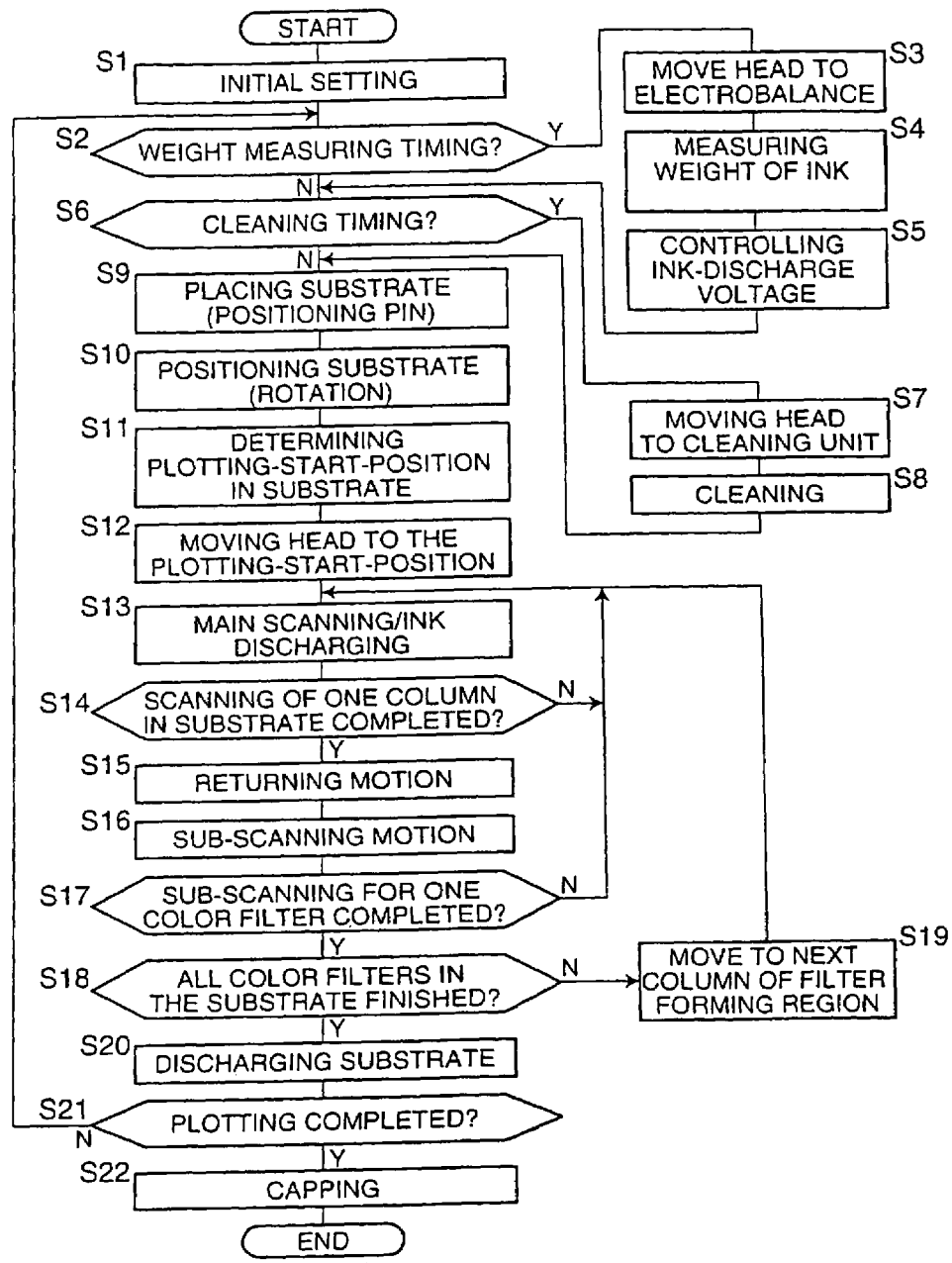
FIG. 16 is a flowchart showing a flow of control executed by the control system shown in FIG. 15.

When the ink jet head 22 is set at the drawing start position in Step S12 shown in FIG. 16, the ink jet head 22 is set at the position (a) shown in FIG. 1. Then, in Step S13, main scanning is started in the main scanning direction X, and at the same time, the discharge of ink is started. More specifically, the main scanning driving device 19, shown in FIG. 10, is operated to linearly move the ink jet head 22 in the main scanning direction X, shown in FIG. 1, at a constant speed. When the nozzle 27 reaches the corresponding filter element area 7 to which ink should be supplied during movement, the ink, i.e., the filter element material, is discharged from the nozzle 27.

At this time, the amount of the ink discharged is smaller than the amount sufficient to fill the total volume of the filter element area 7, and is several fractions of the total amount, for example, one fourth of the total amount, in this embodiment. This is because each of the filter element areas 7 is filled with the ink by several times of ink discharges from the nozzle 27, not by one time of ink discharge. In this embodiment, the total volume is filled with the ink by four times of ink discharges.

When main scanning is completed for one line on the motherboard 12 ("YES" in Step S14), the ink jet head 22 returns to the initial position (a) by reverse movement (Step S15). Furthermore, the ink jet head 22 is driven to be moved by the sub-scanning driving device 21 by the predetermined amount of sub-scanning (referred to as "δ" in this specification) in the sub-scanning direction Y (Step S16).

In this embodiment, the CPU 69 conceptually divides the plurality of the nozzles constituting the nozzle row 28 of the ink jet head 22 shown in FIG. 1 into a plurality of n groups. In this embodiment, n=4, i.e., the nozzle row 28 having a length L and including 180 nozzles 27 is divided into four groups. As a result, each nozzle group has 45 (=180/4) nozzles 27 and has a length L/n, i.e., L/4. The amount δ of sub-scanning is set to an integral multiple of the sub-scanning direction length of the length L/4 of each nozzle group, in other words (L/4) cos θ.

Therefore, after main scanning is completed for one line, the ink jet head 22, returning to the initial position (a), is moved to position (b) by a distance δ in parallel to the sub-scanning direction Y shown in FIG. 1. The amount δ of sub-scanning is not always constant, and varies according to the demand for control. In FIG. 1, the position (a) to the position (k) slightly deviate from each other in the main scanning direction X for the sake of ease of explanation. In fact, the position (a) to position (k) are at the same position in the main scanning direction X.

The ink jet head 22, moved to the position (b) by sub-scanning repeatedly, performs main scanning and ink discharge in Step S13. Then, the ink jet head 22 repeatedly executes main scanning and ink discharge while being moved to the position (c) through the position (k) by sub-scanning (Step S13 to Step S16) to complete ink adhesion to one column of the color filter formation areas 11 of the motherboard 12.

In this embodiment, the nozzle row 28 is divided into the four groups to determine a unit movement amount as a basis for the amount δ of sub-scanning. Therefore, when main scanning and sub-scanning are completed for one column of the the color filter formation areas 11, each of the filter element areas 7 is subjected to one ink discharge from each of the four nozzle groups, i.e., a total of four ink discharges, and thus the predetermined total amount, i.e., the predetermined total thickness of ink, i.e., the filter element material, is supplied to the total volume.

The state of the repeated ink discharges is shown in detail in FIG. 1(A). In FIG. 1(A), characters "a" to "k" denote the ink layers of the filter element material layer 79, which are deposited on the surface of the motherboard 12 by the nozzle row 28 of the ink jet head 22 moved to the positions "a" to "k", respectively. For example, the ink layer "a" shown in FIG. 1(A) is formed by ink discharge from the nozzle row 28 positioned at the position "a" during main scanning, and the ink layer "b" shown in FIG. 1(A) is formed by ink discharge from the nozzle row 28 positioned at the position "b" during main scanning. Similarly, the ink layers "c", "d", . . . shown in FIG. 1(A) are formed by ink discharge from the nozzle row 28 positioned at the positions "c", "d", . . . , respectively, during main scanning.

Namely, in this embodiment, the four nozzle groups of the nozzle row 28 scan four times the same portion of each of the color filter formation areas 11 in the motherboard 12 to discharge ink, obtaining a desired total thickness T. Also, the first layer of the filter element material layer 79, shown in FIG. 1(A), is formed by main scanning with the nozzle row 28 at each of the position "a" and the position "b", shown in FIG. 1. The second layer is formed by main scanning with the nozzle row 28 at each of the positions "c", "d" and "e". The third layer is formed by main scanning with the nozzle row 28 at each of the positions "f", "g" and "h". The fourth layer is formed by main scanning with the nozzle row 28 at each of the positions "i", "j" and "k". As a result, the whole of the filter element material layer 79 is formed.

The first layer, the second layer, the third layer and the fourth layer are described that indicate the number of times of ink discharges for the sake of convenience, and actually, the layers are not physically discriminated from each other, but form a uniform filter element material layer 79 as a whole.

In the embodiment shown in FIG. 1, sub-scanning is executed so that during successive sub-scanning movement of the nozzle row 28 to the position "a" through the position "k", the nozzle row 28 at each of the positions does not overlap with the nozzle row 28 at any of the other positions in the sub-scanning direction Y, but the nozzle row 28 continues between the respective positions in the sub-scanning direction Y. Therefore, the first layer to fourth layer of the filter element material layer 79 have a uniform thickness.

Furthermore, the amount δ of sub-scanning of the ink jet head 22 is set so that the boundary between the positions "a" and "b" of the nozzle row, where the first layer is formed, does not overlap with the boundaries between the positions "c", "d" and "e" of the nozzle row, where the second layer is formed. Similarly, the boundaries in the second layer do not overlap with those in the third layer, and the boundaries in the third layer do not overlap with those in the fourth layer. If the boundaries of the nozzle row 28 in the respective layers overlap with each other without being shifted in the sub-scanning direction, i.e., in the transverse direction shown in FIG. 1(A), stripes are possibly formed at the boundaries. However, when the boundaries in the respective layers are shifted, as in this embodiment, no stripe is formed, and the filter element material layer 79 having a uniform thickness can be formed.

In this embodiment, before the nozzle row 28 is repeatedly moved by main scanning while being moved by sub-scanning by the nozzle group unit to form the filter element material layer 79 having the predetermined thickness T by repeated ink discharges, the nozzle row 28 is successively moved to the position "a" and "b" shown in FIG. 1. Namely, the ink is first discharged in such a manner that the nozzle row 28 at the position "a" does not overlap with the nozzle row 28 at the position "b". The nozzle row 28, however, continues between both positions, uniformly forming the thin filter element material layer over the entire surface of each of the color filter formation areas 11.

In general, the surface of the board 12 is dry with low wettability, and is liable to have low adhesion of ink. Therefore, if a large amount of ink is locally discharged to the surface of the board 12, there is a probability that the ink cannot be sufficiently adhered to the surface, and the ink density distribution becomes nonuniform. However, when the ink is first thinly and uniformly supplied to the entire region of the color filter formation area 11, with preventing the formation of boundaries as much as possible to set the entire surface of the areas 11 in a wet state with a uniform thickness, as in this embodiment, marked boundaries can be prevented from remaining at the ink overlap boundaries during subsequent repeated coating.

When ink discharge is completed for one column of the color filter formation areas 11 of the motherboard 12, as described above, the ink jet head 22 is driven by the sub-scanning driving device 21 and transferred to the initial position of the next column of the color filter formation areas 11 (Step S19). Then, main scanning, sub-scanning and ink discharge are repeated for the next column of the color filter formation areas 11 to form the filter elements in the filter element formation areas 11 (Steps S13 to S16).

Then, when the filter elements 3 of one of the R, G and B colors, for example, R color, are formed in all color filter formation areas 11 of the motherboard 12 ("YES" in Step S18), the motherboard 12, after processing, is exhausted to the outside by the board supply device 23 or another transfer device in Step S20.

Then, the process returns to Step S2 in which the operation of discharging R color ink is repeated for another motherboard 12, unless the end of processing is directed by the operator ("NO" in Step S21).

When the operation end is directed by the operator ("YES" in Step S21), the CPU 69 transfers the ink jet head 22, shown in FIG. 9, to the capping device 76 which executes capping of the ink jet head 22 (Step S22).

After patterning of one of the three colors of R, G and B, for example, R color, which constitute the color filter, is completed, the motherboard 12 is transferred to an ink jet apparatus 16 using the second color of the R, G and B colors, for example, G color, to perform patterning of the G color. The motherboard 12 is finally transferred to an ink jet apparatus 16 using the third color of the R, G and B colors, for example, B color, to perform patterning of the B color. As a result, the motherboard 12 is produced, in which a plurality of the color filters 1 (FIG. 6(a)), having the desired RGB dot arrangement, such as the stripe arrangement or the like, are formed.

In order to use the color filter 1 for a color display of a liquid crystal device, an electrode or an alignment film, for example, are laminated on the surface of the color filter 1. In this case, when the motherboard 12 is cut into the respective color filters 1 before the electrode or the alignment film, etc. is laminated, the subsequent steps of forming the electrode or the alignment film becomes very troublesome. Therefore, in this case, the motherboard 12 is preferably cut after the necessary addition steps of forming the electrode or the alignment film, etc. are completed, not immediately after the color filters 1 are completed on the motherboard 12.

As described above, in the method and apparatus to produce a color filter of this embodiment, each of the filter elements 3 in the color filter 1 shown in FIG. 6(a) is formed to the predetermined thickness by n times of ink discharges, in this embodiment, four times of ink discharges, from the nozzles 27 belonging to the different nozzle groups, not by one time of main scanning with the ink jet head 22 (refer to FIG. 1) in the X direction. Therefore, if there are variations in the amounts of ink discharge from the plurality of the nozzles 27, the occurrence of variations in thickness of the plurality of the filter elements 3 can be prevented, thereby making the distribution properties of light transmission of the color filter uniform in a plane.

Of course, the production method of this embodiment includes forming the filter elements 3 by the ink discharged from the ink jet head 22, and thus need not pass through such a complicated step as one using the photolithography method and thereby causing no waste of material.

Figure 24:
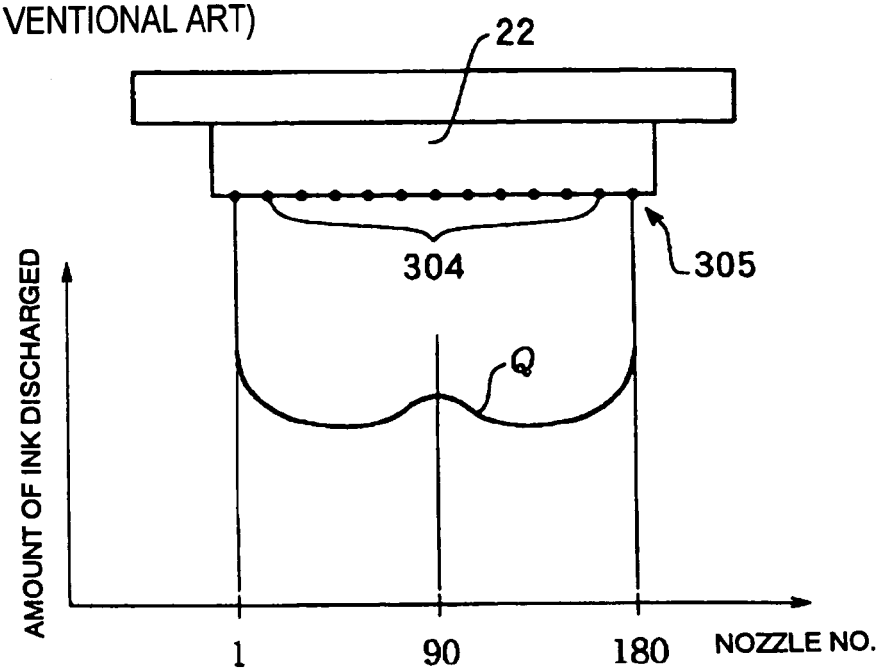
FIGS. 24(a) and 24(b) are schematics for explaining the characteristics of a conventional color filter.
Figure 24:
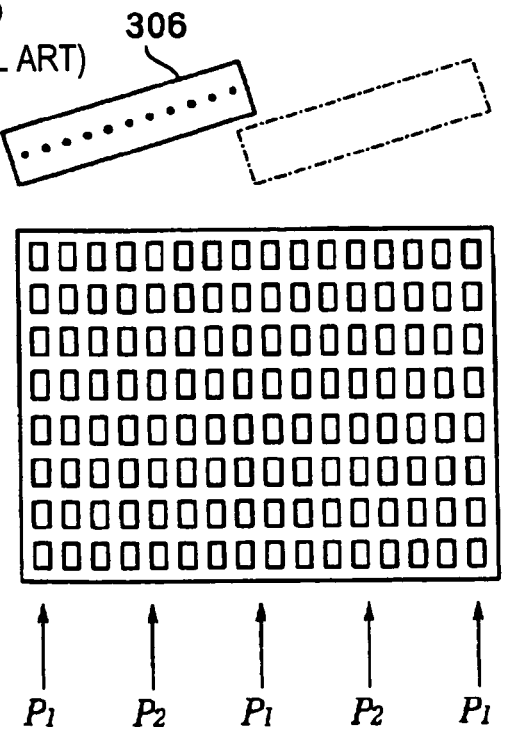

As described above with reference to FIG. 24(a), the plurality of the nozzles 27 including the nozzle row 28 of the ink jet head 22 have a nonuniform distribution of the amounts of ink discharge. Also, as described above, particularly, the amounts of the ink discharged from the nozzles 27 present at both ends of the nozzle row 28, for example, 10 nozzles each at both ends, are large. In this way, the use of the nozzles discharging larger amounts of ink than those of the other nozzles is undesirable for making uniform the thicknesses of the discharged ink films, for example, the filter elements 3.

Therefore, it is preferable that of the plurality of nozzles 27, which constitute the nozzle row 28, some nozzles present at both ends E of the nozzle row 28, for example, about 10 nozzles each at both ends, are previously set not to discharge the ink. The nozzles 27 present in the remaining portion F are divided into the plurality of groups, for example, four groups, so that sub-scanning movement is performed by the nozzle group unit. For example, when the number of the nozzles 28 is 180, conditions such as the applied voltage, for example, are previously set so that no ink is discharged from 10 nozzles at either end, i.e., a total of 20 nozzles, and 160 nozzles in the remaining central portion are conceptually divided into, for example, four groups, each including 160/4=40 nozzles.

Although the first embodiment uses the non-transmissive resin material as the partition 6, a light transmitting resin material can also be used as the partition 6. In this case, a light shielding metal film or resin material may be provided at the positions corresponding to the spaces between the respective filter elements, for example, above or below the partition 6, to form a black mask.

Although the first embodiment uses the filter elements of R, G and B, of course, the filter elements are not limited to R, G and B, and for example, C (cyan), M (magenta), and Y (yellow) may be used. In this case, filter element materials having C, M and Y colors may be used in place of the filter element materials of R, G and B.

Although, in the first embodiment, the partition 6 is formed by photolithography, the partition 6 can be formed by the same ink jet method as the color filter.

Second Embodiment

Figure 2:
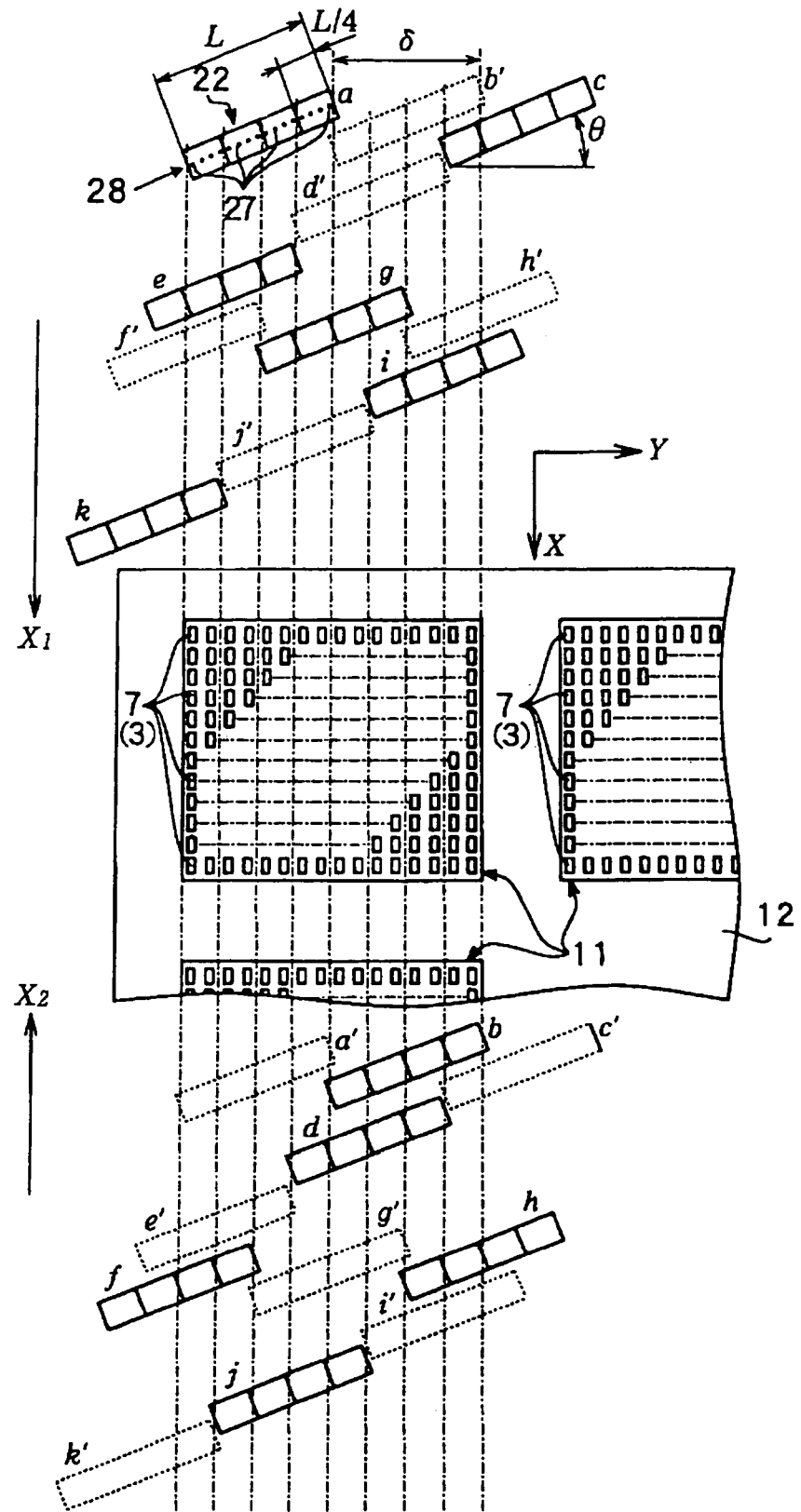
FIG. 2 is a plan view schematically showing a main step of a method of producing a color filter according to another embodiment of the present invention.

FIG. 2 schematically shows a case in which ink, for example, a filter element material, is discharged into each of the filter element formation areas 7 in the color filter formation areas 11 of the motherboard 12 from the ink jet head 22, using a method and apparatus to produce a color filter according to another embodiment of the present invention.

The outlines of the steps performed in this embodiment are the same as those shown in FIG. 7, and the ink jet apparatus used to discharge ink is also mechanically the same as the apparatus shown in FIG. 9. This embodiment is also the same as the embodiment shown in FIG. 1 in that the plurality of the nozzles 27 constituting the nozzle row 28 are conceptually divided into n groups, for example, four groups, by the CPU 69 shown in FIG. 15, so that the amount δ of sub-scanning is determined by the length of each nozzle group, L/n, or L/4 as an unit amount.

This embodiment is different from the embodiment shown in FIG. 1 in that the program software stored in the memory 71 shown in FIG. 15 is modified. Specifically, the main scanning operation and sub-scanning operation, which are performed by the CPU 69, are modified.

More specifically, in FIG. 2, after main scanning movement in the X1 direction is completed, the ink jet head 22 is immediately moved to position (b) by sub-scanning by a moving amount δ, corresponding to the four nozzle groups in the Y direction, without returning to the initial position. Ink jet head 22 is then moved by main scanning in the direction X2, opposite to the previous main scanning direction X1, to return to position (b'), deviating from initial position (a) by a distance δ in the sub-scanning direction.

The ink is selectively discharged from the plurality of the nozzles 27 during main scanning from position (a) to position (a') and during main scanning from position (b) to position (b').

In this embodiment, main scanning and sub-scanning with the ink jet head 22 are alternately performed without the returning operation being performed therebetween, thereby omitting the time required for the returning operation to shorten the working time.

Third Embodiment

Figure 3:
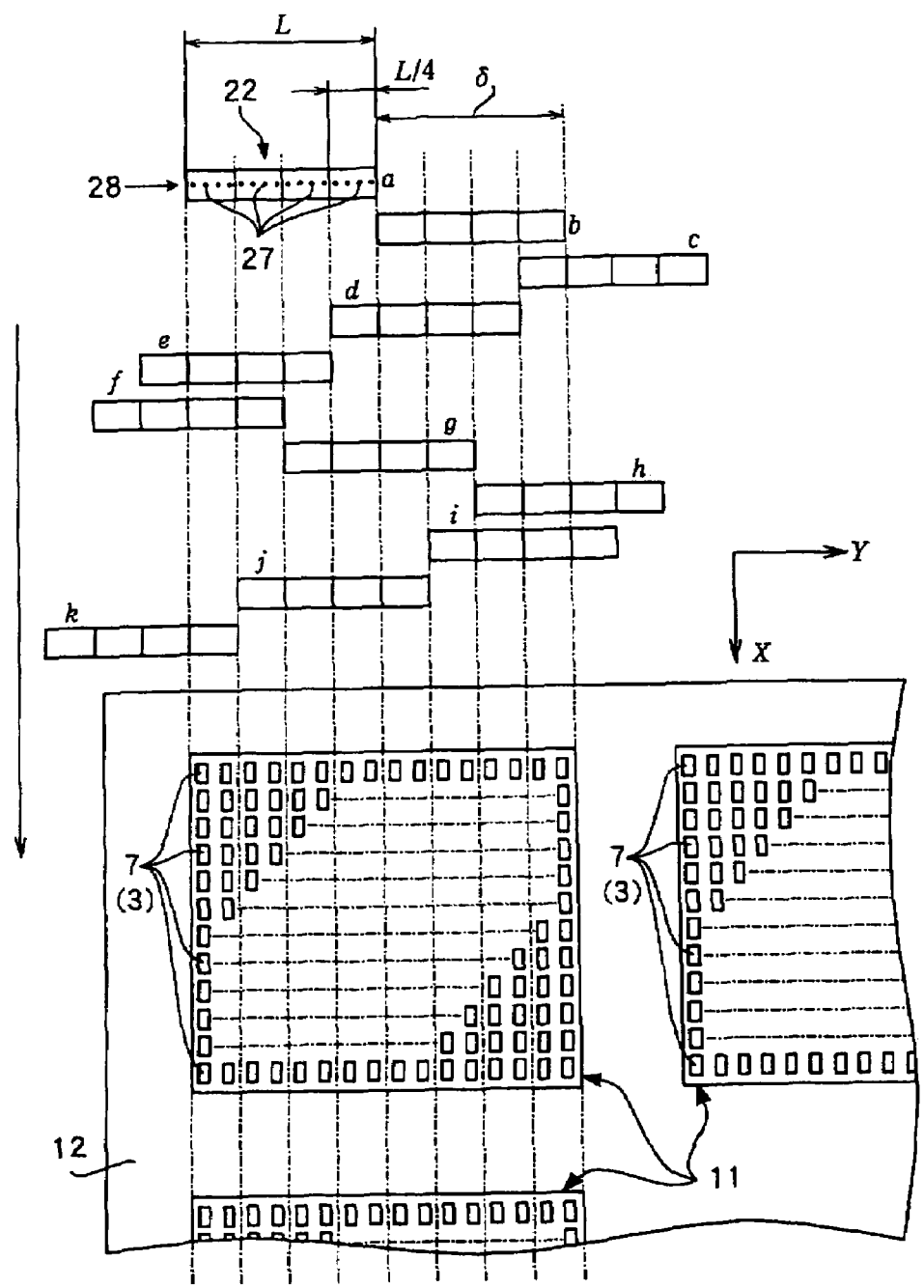
FIG. 3 is a plan view schematically showing a main step of a method of producing a color filter according to still another embodiment of the present invention.

FIG. 3 schematically shows a case in which ink, for example, a filter element material, is discharged to each of the filter element formation areas 7 in the color filter formation areas 11 of the motherboard 12 from the ink jet head 22, using a method and apparatus to produce a color filter according to still another embodiment of the present invention.

The outlines of the steps performed in this embodiment are the same as these shown in FIG. 7, and the ink jet apparatus used to discharge ink is also mechanically the same as the apparatus shown in FIG. 9. This embodiment is also the same as the embodiment shown in FIG. 1 in that the plurality of the nozzles 27, constituting the nozzle row 28, are conceptually divided into n groups, for example, four groups, by the CPU 69 shown in FIG. 15.

This embodiment is different from the embodiment shown in FIG. 1, in that when the ink jet head 22 is set at the drawing start position of the motherboard 12 in Step S12, shown in FIG. 16, the nozzle row 28 of the ink jet head 22 is positioned in parallel with the sub-scanning direction Y, as shown by position (a) in FIG. 3. This nozzle arrangement structure is advantageous for a case in which the nozzle pitch of the ink jet head 22 is the same as the element pitch of the motherboard 12.

In this embodiment, the main scanning movement in the X direction, the return movement to the initial position, and the sub-scanning movement in the Y direction by an amount δ of sub-scanning movement (the amount δ changes by an integral multiple of the nozzle group length as a unit according to demand) are repeated until the ink jet head 22 reaches end position (k) from the initial position (a). During main scanning movement, the ink, for example, the filter element material, is selectively discharged from the plurality of the nozzles 27 to deposit the filter element material to each of the filter element formation areas 7 in the color filter formation areas 11 of the motherboard 12.

In this embodiment, the nozzle row 28 is set in parallel to the sub-scanning direction, and thus the amount δ of sub-scanning movement is determined by the length of each nozzle group, L/n, i.e., L/4, as a reference unit amount.

Fourth Embodiment

Figure 4:
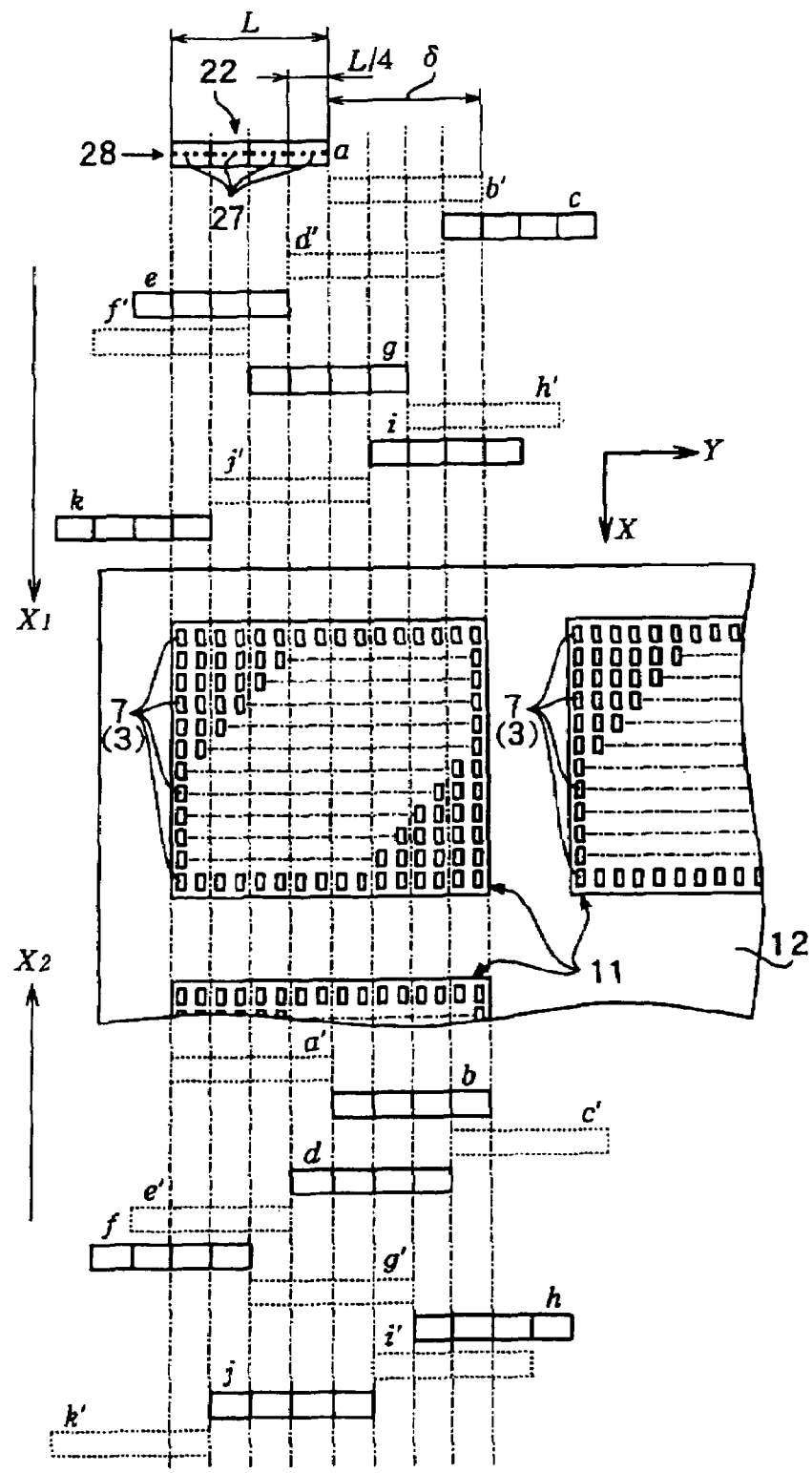
FIG. 4 is a plan view schematically showing a main step of a method of producing a color filter according to a further embodiment of the present invention.

FIG. 4 schematically shows a case in which ink, for example, a filter element material, is discharged to each of the filter element formation areas 7 in the color filter formation areas 11 of the motherboard 12 from the ink jet head 22, using a method and apparatus that produces a color filter according to a further embodiment of the present invention.

The outlines of the steps performed in this embodiment are the same as those shown in FIG. 7, and the ink jet apparatus used to discharge ink is also mechanically the same as the apparatus shown in FIG. 9. This embodiment is also the same as the embodiment shown in FIG. 1 in that the plurality of the nozzles 27 constituting the nozzle row 28 are conceptually divided into n groups, for example, four groups, by the CPU 69 shown in FIG. 15.

This embodiment is different from the embodiment shown in FIG. 1, in that when the ink jet head 22 is set at the drawing start position of the motherboard 12 in Step S12, shown in FIG. 16, the nozzle row 28 of the ink jet head 22 is positioned in parallel with the sub-scanning direction Y, as shown by position (a) in FIG. 3. As in the embodiment shown in FIG. 2, main scanning and sub-scanning with the ink jet head 22 are alternately performed without the returning operation being performed therebetween.

Figure 12:
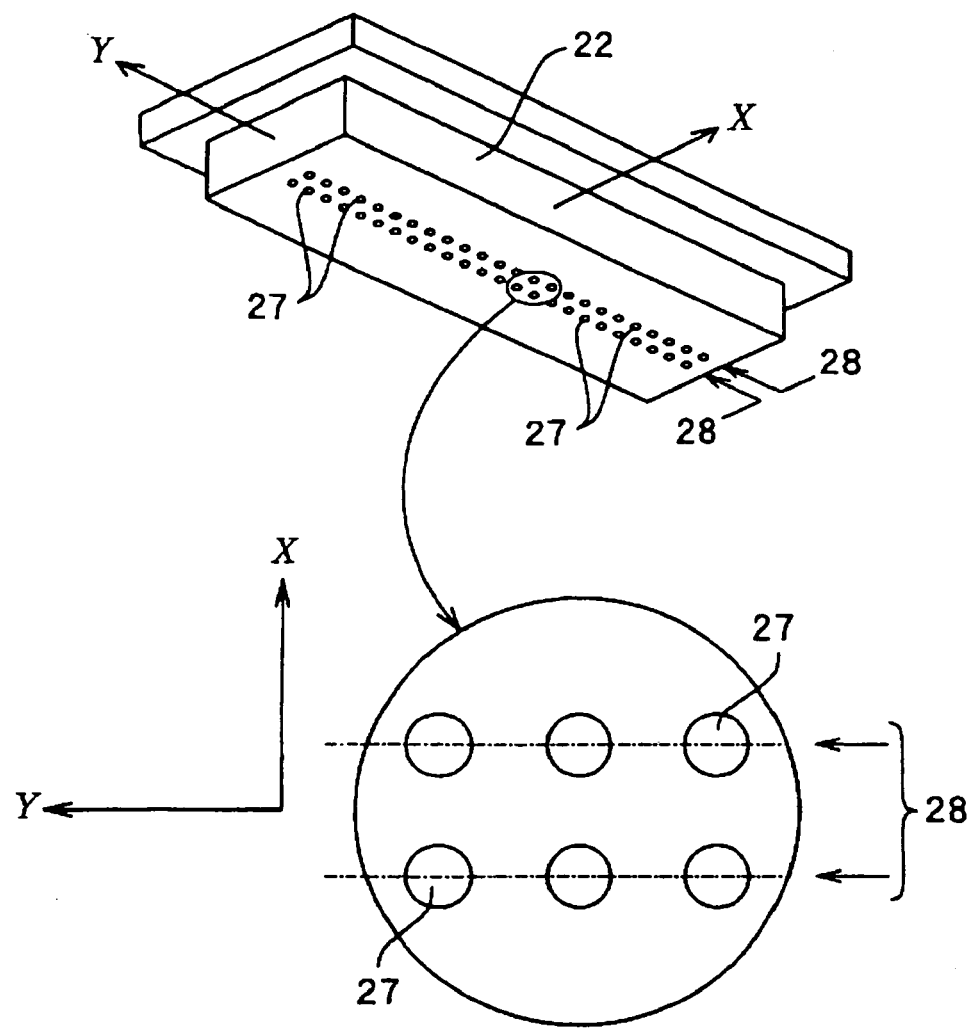
FIG. 12 is a perspective view showing a modified example of an ink jet head.
Figure 14:
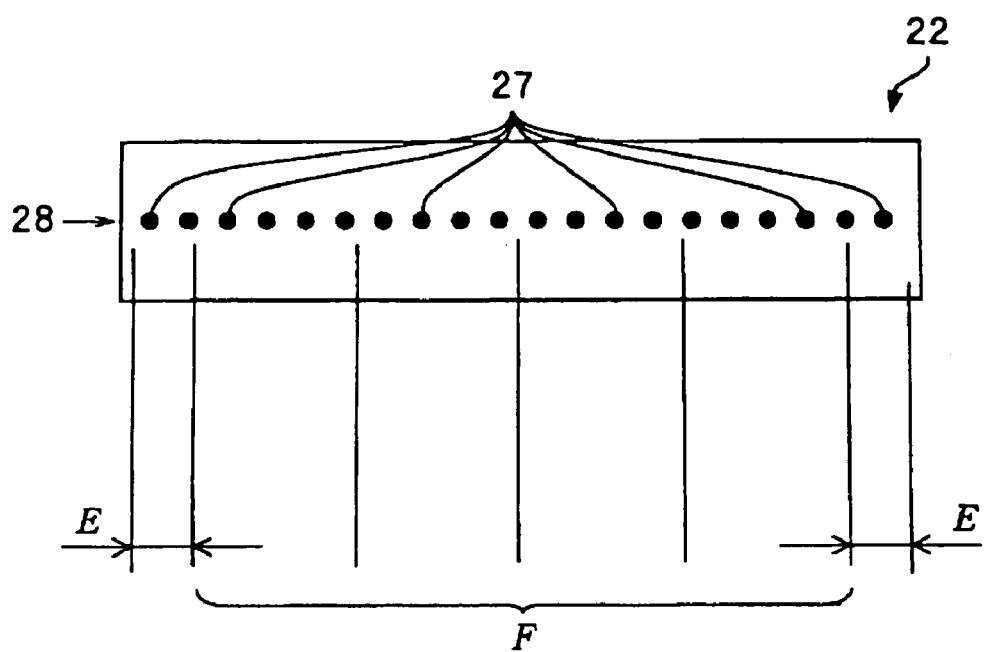
FIG. 14 is a plan view showing a modified example of an ink jet head.

In this embodiment shown in FIG. 4, and the embodiment shown in FIG. 3, the main scanning direction is perpendicular to the nozzle row 28. Therefore, by providing two nozzle rows 28 along the sub-scanning direction Y, as shown in FIG. 12, the filter element material can be supplied to one filter element area 7 from the two nozzles 27 positioned in the same main scanning line.

Fifth Embodiment

Figure 5:
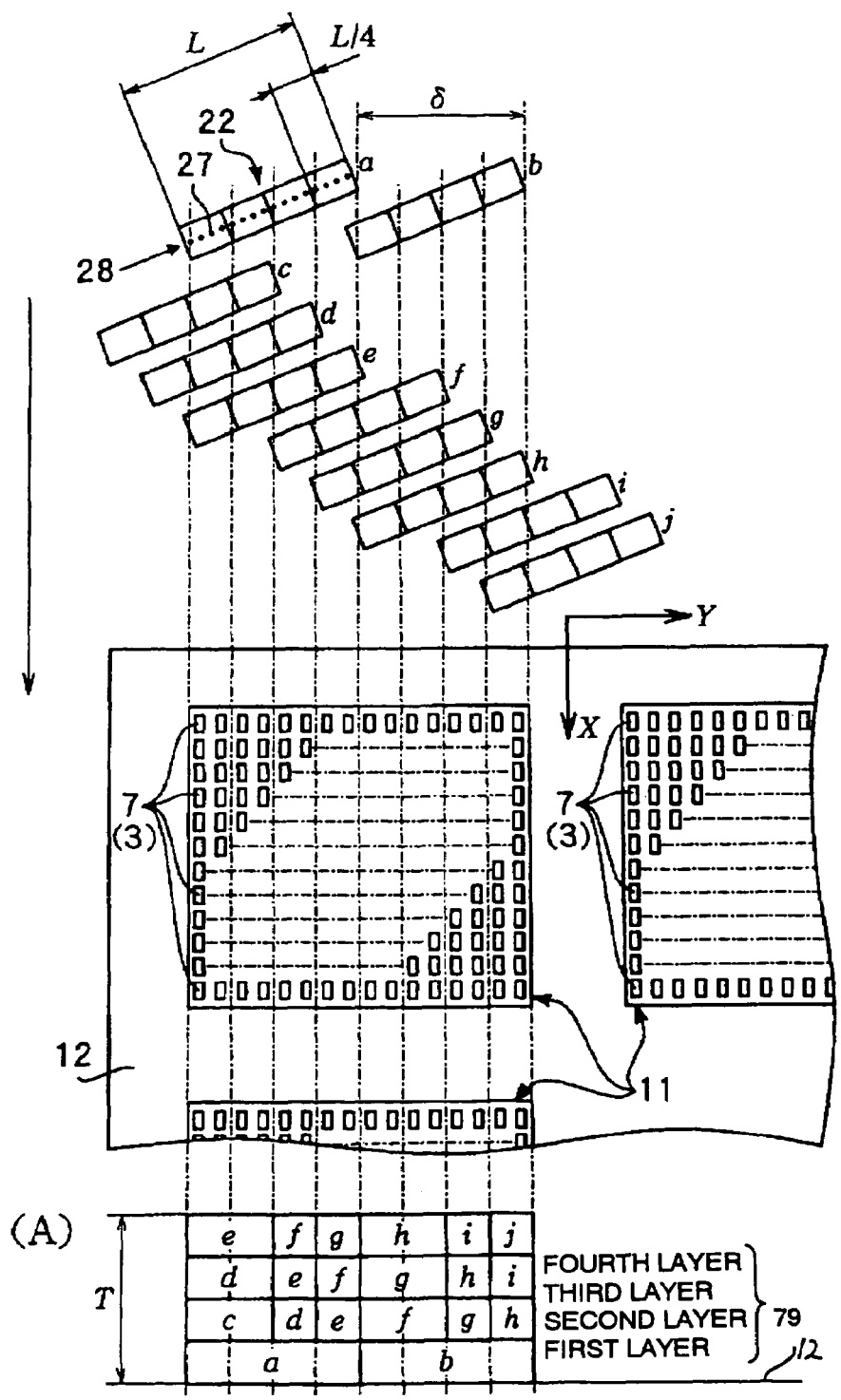
FIG. 5 is a plan view schematically showing a main step of a method of producing a color filter according to a still further embodiment of the present invention.

FIG. 5 schematically shows a case in which ink, for example, a filter element material, is discharged to each of the filter element formation areas 7 in the color filter formation areas 11 of the motherboard 12 from the ink jet head 22, using a method and apparatus to produce a color filter according to a still further embodiment of the present invention.

The outlines of the steps performed in this embodiment are the same as these shown in FIG. 7, and the ink jet apparatus used to discharge ink is also mechanically the same as the apparatus shown in FIG. 9. This embodiment is also the same as the embodiment shown in FIG. 1 in that the plurality of the nozzles 27 constituting the nozzle row 28 are conceptually divided into n groups, for example, four groups, by the CPU 69 shown in FIG. 15.

In the embodiment shown in FIG. 1, the nozzle row 28 is continuously moved by sub-scanning, without overlapping, to form the first layer of the filter element material layer 79 in a uniform thickness on the surface of the board 12. The second layer, the third layer and the fourth layer are successively laminated in a uniform thickness on the first layer. In the embodiment shown in FIG. 5, the method of forming the first layer is the same as shown in FIG. 1(A). However, the second to fourth layers are formed partially, stepwise, from the left side shown in FIG. 5(A), not successively formed in a uniform thickness, to finally form the filter element material layer 79.

In the embodiment shown in FIG. 5, the positions of the nozzle row 28 in the first to fourth layers overlap with each other, resulting, possibly, in dark stripes occurring at the boundaries between the positions of the nozzle rows 28. However, in this embodiment, the first layer is formed to a uniform thickness over the entire surface of each of the color filter formation areas 11 to enhance wettability in the first step. The second to fourth layers are then laminated on the first layer, thereby uniformly forming the first layer with a uniform thickness over the entire surface. Therefore, a color filter, having uniform density and less stripes at the boundaries, can be formed, as compared with the case in which the first to fourth layers are formed stepwise from the left side.

Sixth Embodiment

Figure 17:
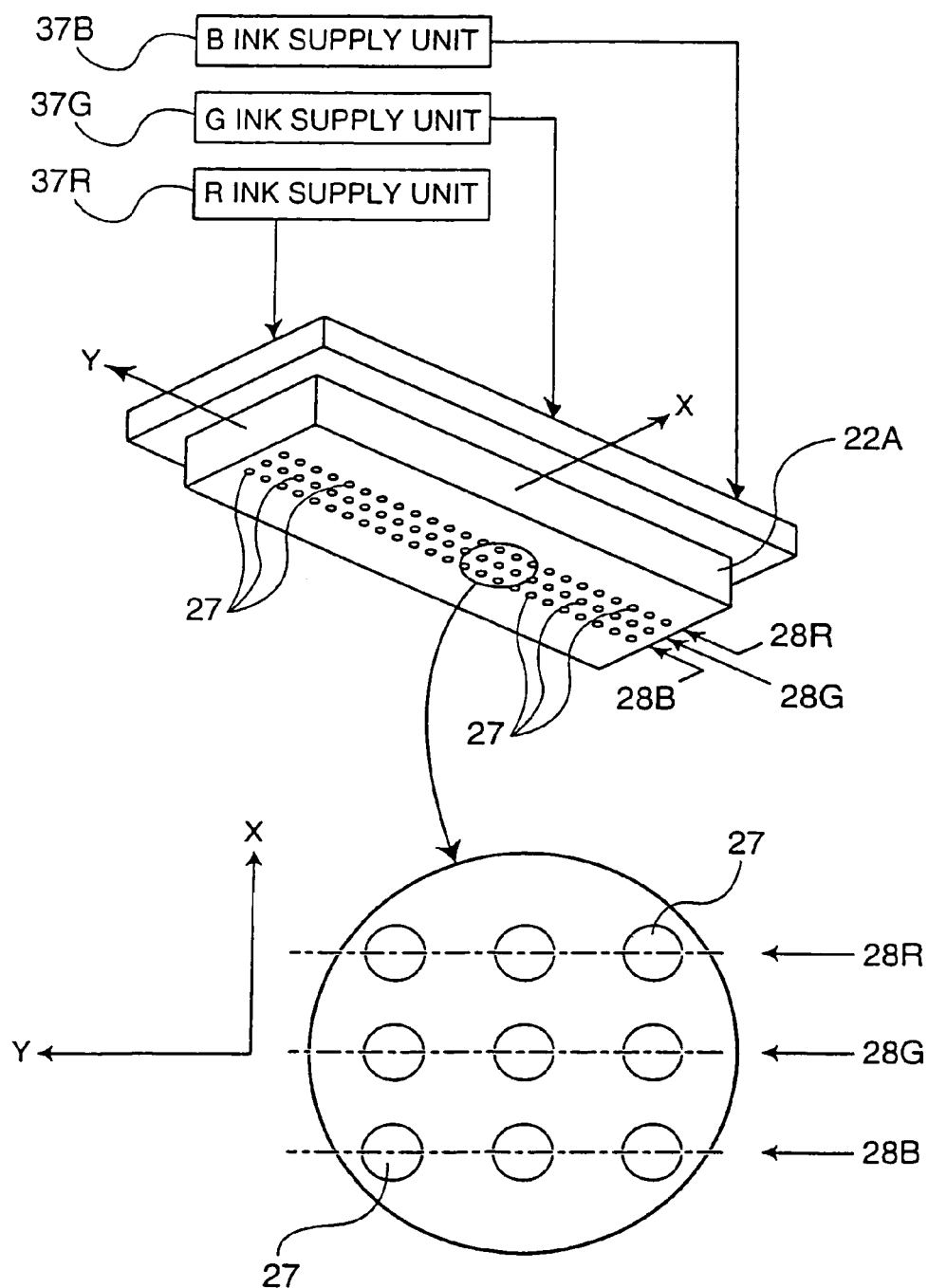
FIG. 17 is a perspective view showing another modified example of an ink jet head.

FIG. 17 shows an ink jet head 22A used in a method and apparatus to produce a color filter, according to a further embodiment of the present invention. The ink jet head 22A is different from the ink jet head 22 shown in FIG. 11 in that three nozzle rows that include a nozzle row 28R to discharge R color ink, a nozzle row 28G to discharge G color ink and a nozzle row 28B to discharge G color ink are formed in the ink jet head 22A. The ink discharge system shown in FIGS. 13(a) and 13(b) is provided for each of the three nozzle rows. Furthermore, a R ink supply device 37R is connected to the ink discharge system corresponding to the R color nozzle row 28R, a G ink supply device 37G is connected to the ink discharge system corresponding to the G color nozzle row 28G, and a B ink supply device 37B is connected to the ink discharge system corresponding to the B color nozzle row 28B.

The outlines of the steps performed in this embodiment are the same as those shown in FIG. 7. The ink jet apparatus used to discharge ink is also mechanically the same as the apparatus shown in FIG. 9. This embodiment is also the same as the embodiment shown in FIG. 1 in that the plurality of the nozzles 27 constituting the nozzle rows 28R, 28G and 28B are conceptually divided into n groups, for example, four groups, by the CPU 69 shown in FIG. 15 so that the ink jet head 22A is moved by sub-scanning by the movement amount δ of sub-scanning for each nozzle group.

In the embodiment shown in FIG. 1, one nozzle row 28 is provided on the ink jet head 22, and thus the ink jet apparatus 16 shown in FIG. 9 must be prepared for each of the three colors R, G and B to form the color filter having three colors R, G and B. On the other hand, in use of the ink jet head 22A having the structure shown in FIG. 17, the three colors R, G and B can be simultaneously adhered to the motherboard 12 by one main scanning with the ink jet head 22A in the X direction, and thus only one ink jet apparatus 16 and only one head 22 may be prepared.

Seventh Embodiment

Figure 18:
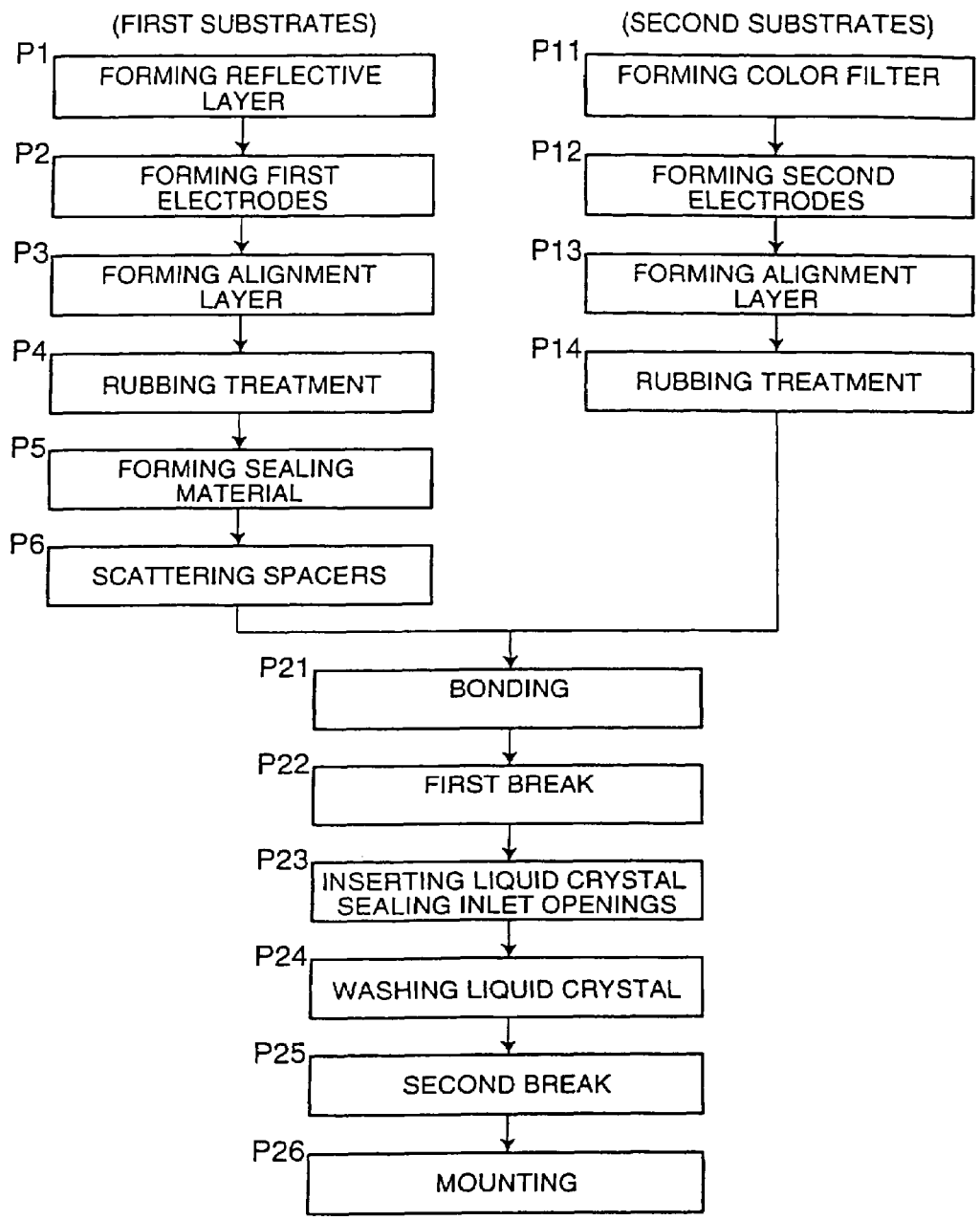
FIG. 18 is a flowchart showing the steps of a method of manufacturing a liquid crystal device according to an embodiment of the present invention.
Figure 19:
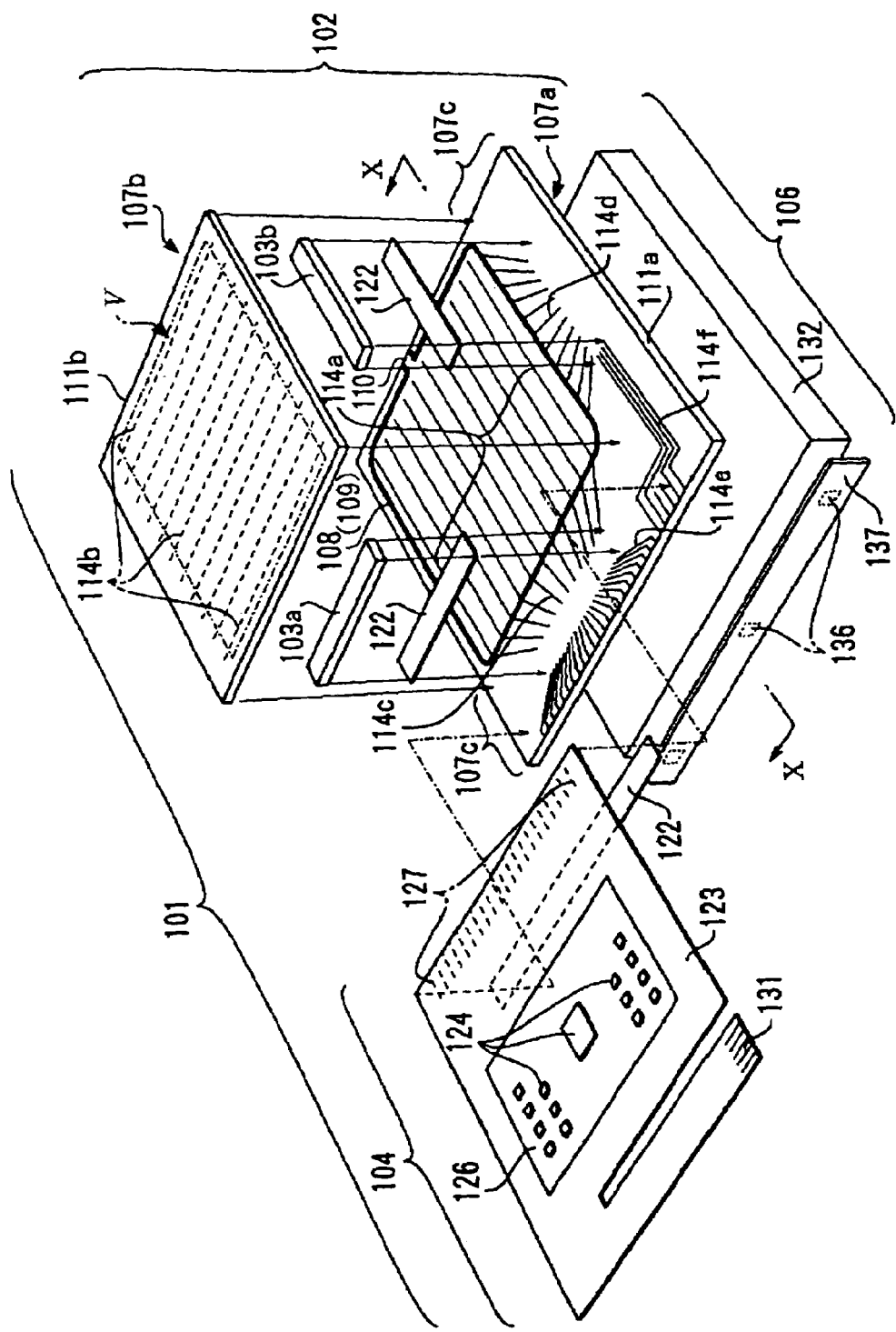
FIG. 19 is an exploded perspective view showing an example of a liquid crystal device manufactured by the method of manufacturing a liquid crystal device of the present invention.
Figure 20:
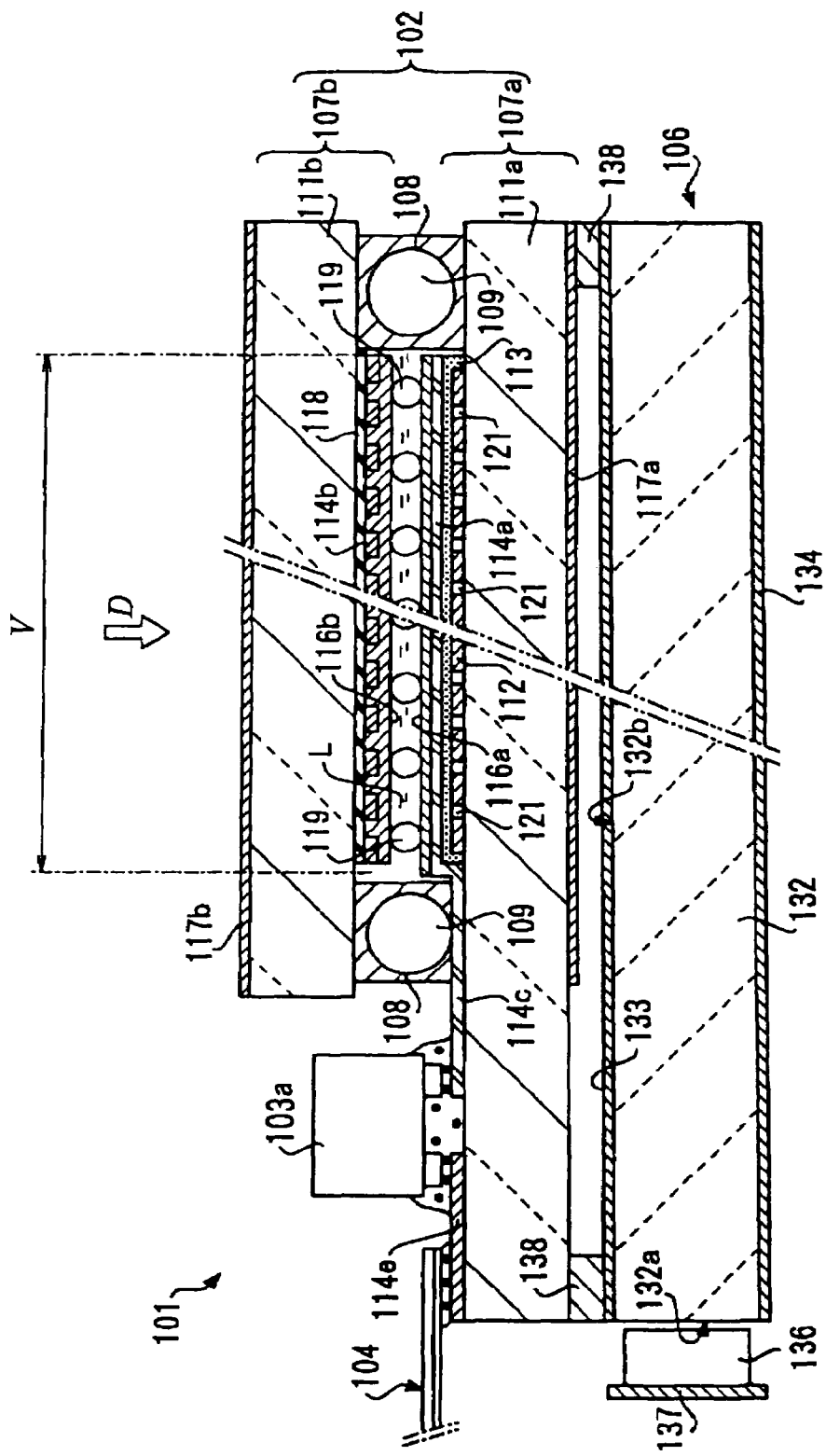
FIG. 20 is a sectional view showing the sectional structure of the liquid crystal device taken along plane X-X in FIG. 19.

FIG. 18 shows a method of manufacturing a liquid crystal device according to a further embodiment of the present invention. FIG. 19 shows a liquid crystal device manufactured by the manufacturing method according to a further embodiment of the present invention. FIG. 20 shows a sectional structure of the liquid crystal device taken along line X-X in FIG. 19. Before the method and apparatus to manufacture a liquid crystal device are described, a liquid crystal device manufactured by the manufacturing method is described with reference to an example. The liquid crystal device of the embodiment is a transflective liquid crystal device which performs a full-color display in a single matrix system.

In FIG. 19, a liquid crystal device 101 includes a liquid crystal panel 102, a liquid crystal driving ICs 103a and 103b mounted on the liquid crystal panel 102, a FPC (Flexible Printed Circuit) 104 connected as a wiring connection component to the liquid crystal panel 102, and an illumination device 106 providing as a back light on the back side of the liquid crystal panel 102.

The liquid crystal panel 102 is formed by bonding together a first substrate 107a and a second substrate 107b with a sealing material 108. The sealing material 108 is formed by circularly adhering an epoxy resin to the inner surface of the first substrate 107a or the second substrate 107b by, for example, screen printing or the like. The sealing material 108 contains a spherical or cylindrical conductor 109 dispersed therein and made of a conductive material, as shown in FIG. 20.

In FIG. 20, the first substrate 107a includes a plate-like substrate 111a made of transparent glass, transparent plastic, or the like. Also, a reflecting film 112 is formed on the inner surface (the upper surface shown in FIG. 20) of the substrate 111a. An insulating film 113 is laminated on the reflecting film 112. First electrodes 114a are formed in stripes (refer to FIG. 19) on the insulating film 113 as viewed from the direction of arrow D, and an alignment film 116a is formed on the first electrodes 114a. Furthermore, a polarizer plate 117a is mounted on the outer surface (the lower surface shown in FIG. 20) of the substrate 111a by bonding or the like.

Although, in FIG. 19, in order to make the arrangement of the first electrodes 114a easy to understand, the stripes of the first electrodes 114a are shown with larger spaces than the actual spaces and in a smaller number than the actual number, resulting in more first electrodes 114a actually forming on the substrate 111a.

In FIG. 20, the second substrate 107b includes a plate-like substrate 111b made of transparent glass, transparent plastic, or the like. Also, a color filter 118 is formed on the inner surface (the lower surface shown in FIG. 20) of the substrate 111b, second electrodes 114b are formed in stripes (refer to FIG. 19) perpendicularly to the first electrodes 114a as viewed from the direction of arrow D, and an alignment film 116b is formed on the second electrodes 114b.

Furthermore, a polarizer plate 117b is mounted on the outer surface (the upper surface shown in FIG. 20) of the substrate 111b by bonding or the like.

Although, in FIG. 19, like the first electrodes 114a, in order to make the arrangement of the second electrodes 114b easy to understand, the stripes of the second electrodes 114b are shown with larger spaces than the actual spaces, and in a smaller number than the actual number, resulting in more second electrodes 114b actually forming on the substrate 111b.

In FIG. 20, a liquid crystal, for example, a STN (Super Twisted Nematic) liquid crystal L, is sealed in the gap, i.e., the cell gap, surrounded by the first substrate 107a, the second substrate 107b and the sealing material 108. Many spherical small spacers 119 are dispersed on the inner surface of the first substrate 107a or the second substrate 107b so that the thickness of the cell gap is maintained by the spacers 119 present in the cell gap.

The first electrodes 114a and the second electrode 114b are arranged perpendicularly to each other, and the intersections are arranged in a dot matrix, as viewed from the direction of arrow D in FIG. 20. Each of the intersections of the dot matrix forms one picture element pixel. The color filter 118 includes components of the colors R (red), G (green) and B (blue), which are arranged in a predetermined pattern, for example, a stripe pattern, a delta pattern, or a mosaic pattern, as viewed from the direction of arrow D. Each of the picture element pixels corresponds to each of the colors R, G and B, and a unit of the picture element pixels of the three colors R, G and B form a pixel.

The plurality of the picture element pixels, i.e., pixels, which are arranged in a dot matrix, are selectively illuminated to display an image of a character, a numeric character, or the like, on the outside of the second substrate 107b of the liquid crystal panel 102. The area in which such an image is displayed is an effective pixel area which is shown in a planar rectangular area by an arrow V in FIGS. 19 and 20.

In FIG. 20, the reflecting film 112 is made of a light reflecting material such as an APC alloy, Al (aluminum), or the like, and an aperture 121 is formed at the position corresponding to each of the picture element pixels at the intersections of the first electrode 114a and the second electrodes 114b. Consequently, the apertures 121 are arranged in the same dot matrix as the picture element pixels, as viewed from the direction of arrow D in FIG. 20.

The first electrodes 114a and the second electrodes 114b are made of, for example, a transparent conductive material ITO. Each of the alignment films 116a and 116b is formed by adhering a polyimide resin in a film form having a uniform thickness. The alignment films 116a and 116b are rubbed to determine the initial orientation of the liquid crystal molecules on the surfaces of the first substrate 107a and the second substrate 107b.

In FIG. 19, the first substrate 107a is formed in a wider area than the second substrate 107b, and when both substrates are bonded together with the sealing material 108, the first substrate 107a has a substrate overhang 107c overhanging outward from the second substrate 107b. In addition, various types of wiring are formed in an appropriate pattern on the substrate overhang 107c. The various types of wiring include lead wiring 114c extending from the first electrodes 114a; lead wiring 114d connected to the second electrodes 114b on the second substrate 107b through the conductors 109 (refer to FIG. 20) present in the sealing material 108; metal wiring 114e connected to an input bump, for example, an input terminal, of the liquid crystal driving IC 103a; and metal wiring 114f connected to an input bump, for example, an input terminal, of the liquid crystal driving IC 103b.

In this embodiment, the lead wiring 114c extending from the first electrodes 114a and the lead wiring 114d connected to the second electrodes 114b are made of the same material ITO as the electrodes, for example, a conductive oxide. The metal wirings 114e and 114f serving as input wirings of the liquid crystal driving ICs 103a and 103b are made of a metal material having a low electric resistance value, for example, an APC alloy. The APC alloy mainly contains Ag, and Pd and Cu as additive components, and is formed of 98% Ag, 1% Pd, and 1% Cu.

The liquid crystal driving ICs 103a and 103b are mounted on the surface of the substrate overhang 107c by bonding with an ACF (Anisotropic Conductive Film) 122. Namely, in this embodiment, the liquid crystal panel is a so-called COG (Chip On Glass) type liquid crystal panel having a structure in which a semiconductor chip is mounted directly on a substrate. In the COG type mounting structure, the input-side bumps of the liquid crystal driving ICs 103a and 103b are conductively connected to the metal wirings 114e and 114f, and the output-side bumps of the liquid crystal driving ICs 103a and 103b are conductively connected to the lead wirings 114c and 114d.

In FIG. 19, the FPC 104 includes a flexible resin film 123, a circuit 126 including chip parts 124, and metal wiring terminal 127. The circuit 126 is mounted directly on the surface of the resin film 123 by soldering or another conductive connection device. The metal wiring terminals 127 are made of an APC alloy, Cr, Cu, or another conductive material. The portion of the FPC 104 in which the metal wiring terminals 127 are formed is connected, with the ACF 122, to the portion of the first substrate 107a in which the metal wirings 114e and 114f are formed. The metal wirings 114e and 114f on the substrate side are connected to the metal wiring terminals 127 on the FPC side by the function of the conductive particles contained in the ACF 122.

Furthermore, an external connection terminal 131 is formed at the side of the FPC 104 opposite to the liquid panel side so that the external connection terminal 131 is connected to an external circuit not shown in the drawing. Therefore, the liquid crystal driving ICs 103a and 103b are driven based on the signal transmitted from the external circuit to supply a scanning signal to either of the first and second electrodes 114a and 114b, a data signal being supplied to the other electrodes. As a result, the voltage of each of the picture element pixels arranged in the dot matrix in the effective display area V is controlled for each pixel, and thus the orientation of the liquid crystal L is controlled for each picture element pixel.

In FIG. 19, the illumination device 106, functioning as the so-called back light, includes a photoconductor 132 composed of an acrylic resin, a diffusion sheet 133 provided on the light emission plane 132b of the photoconductor 132, a reflecting sheet 134 provided on the plane of the photoconductor 132 opposite to the light emission plane 132b, and a LED (Light Emitting Diode) 136 serving as a light emission source, as shown in FIG. 20.

The LED 136 is supported by an LED substrate 137 which is mounted on a supporting member (not shown in the drawing), for example, which is formed integrally with the photoconductor 132. By mounting the LED substrate 137 at the predetermined position of the supporting member, the LED 136 is located at the position opposite to the light incidence plane 132a of the photoconductor 132, which is a side-surface thereof. Reference numeral 138 denotes a buffer for buffering an impact applied to the liquid crystal panel 102.

When the LED 136 emits light, the light is incident on the light incidence plane 132a, introduced into the photoconductor 132, and transmitted therethrough while being reflected by the reflecting sheet 134 and the wall surfaces of the photoconductor 132. During transmittance, the light is emitted as planar light to the outside from the light emission plane 132b through the diffusion sheet 133.

In the liquid crystal device 101 of this embodiment, having the above-described construction, therefore, with sufficiently bright external light such as sunlight, room light, or the like, the external light is introduced into the liquid crystal panel 102 from the second substrate 107b side, transmitted through the liquid crystal L, and then reflected by the reflecting film 112 to be again supplied to the liquid crystal L. The orientation of the liquid crystal L is controlled for each of the picture element pixels of R, G and B by the electrodes 114a and 114b holding the liquid crystal L therebetween, thereby modulating the light supplied to the liquid crystal L for each picture element pixel. Using modulation, the light transmitted through the polarizer plate 117b and light not transmitted through the polarizer plate 117b form an image, such as a character, a numeric character, or the like, on the outside of the liquid crystal panel 102. As a result, a reflective display is performed.

On the other hand, with an insufficient quantity of external light, light emitted from the LED 136 is emitted as planar light from the light emission plane 132b of the photoconductor 132, and the light is supplied to the liquid crystal L through the apertures 121 formed in the reflecting film 112. Like in the reflective display, in this case, the supplied light is modulated for each picture element pixel by the liquid crystal L with the controlled orientation, thereby displaying an image on the outside. As a result, a transmissive display is performed.

The liquid crystal device 101 having the above construction is manufactured by, for example, the manufacturing method shown in FIG. 18. In this manufacturing method, a series of steps from step P1 to step P6 are steps of forming the first substrate 107a, and a series of steps from step P11 to step P14 are steps of forming the second substrate 107b. The first substrate forming process and the second substrate forming process are separately performed.

First, the first substrate forming process is described. The reflecting film 112 for a plurality of liquid crystal panels 102 is formed on the surface of a large-area mother raw material base made of light transmitting glass, light transmitting plastic, or the like by the photolithography method, and the insulating film 113 is formed on the reflecting film 112 by a known deposition method (Step P1). Next, the first electrodes 114a and the wirings 114c, 114d, 114e and 114f are formed by the photolithography process (Step P2).

Next, the alignment film 116a is formed on the first electrodes 114a by coating, printing, or the like (Step P3), and then the alignment film 116a is rubbed to determine the initial orientation of the liquid crystal (Step P4). Next, the sealing material 108 is circularly formed by, for example, screen printing or the like (Step P5), and then the spherical spacers 119 are dispersed on the sealing material 108 (Step P6). As a result, a large-area mother first substrate is formed, in which a plurality of panel patterns are formed on the first substrates 107a of the liquid crystal panels 102.

The second substrate forming process (Step P11 to Step P14 shown in FIG. 18) is carried separately from the first substrate forming process. First, a large-area mother raw material base made of light transmitting glass, light transmitting plastic, or the like is prepared, and the color filter 118 for a plurality of the liquid crystal panels 102 is formed on the surface of the mother raw material base (Step P11). The color filter is formed by the production method shown in FIG. 7, in which the filter elements of each of the R, G and B colors are formed by using the ink jet apparatus 16 shown in FIG. 9, according to any one of the methods of controlling an ink jet head shown in FIGS. 1, 2, 3, 4, and 5. The method of producing a color filter, and the method of controlling an ink jet head are the same as described above, and description thereof is thus omitted.

As shown in FIG. 7(d), the color filter 1, for example, the color filter 118 is formed on the motherboard 12, for example, the mother raw material base. Then, the second electrodes 114b are formed by the photolithography process (Step P12), and the alignment film 116b is formed by coating, printing, or the like (Step P13). Then, the alignment film 116b is rubbed to determine the initial orientation of the liquid crystal (Step P14). As a result, a second large-area mother substrate is formed, in which a plurality of panel patterns are formed on the second substrates 107b of the liquid crystal panels 102.

After the large-area motherboards first and second substrates are formed as described above, both motherboards are aligned with each other with the sealing material 108 provided therebetween, and then bonded together (Step P21). As a result, an empty panel structure containing a panel portion for a plurality of liquid crystal panels is formed with no liquid crystal sealed therein.

Next, scribe grooves, for example, cutting grooves, are formed at predetermined positions of the completed empty panel structure, and then the panel structure is broken, i.e., cut, based on the scribe grooves (Step P22). Consequently, a rectangular empty panel structure is formed, in which a liquid crystal inlet opening 110 (refer to FIG. 19) of the sealing material 108 of each of the liquid crystal panels is exposed to the outside.

Then, the liquid crystal L is injected into the liquid crystal panel through the exposed liquid crystal inlet opening 110, and the liquid crystal inlet opening 110 is then sealed with a resin or the like (Step P23). The liquid crystal is generally injected by, for example, a method in which a storage reservoir in which the liquid crystal is stored. The rectangular empty panel is placed in a chamber and dipped in the liquid crystal in the chamber after the chamber is put into a vacuum state. The chamber is then opened to the atmospheric pressure. At this time, the inside of the empty panel is in a vacuum state, and the liquid crystal is pressurized by the atmospheric pressure introduced into the panel through the liquid crystal inlet opening. Since the liquid crystal adheres to the surfaces of the liquid crystal panel structure after being injected in the panel structure, the rectangular panel is cleaned in Step P24 after the liquid crystal is injected.

Then, after injection of the liquid crystal and cleaning, scribe grooves are again formed at predetermined positions of the rectangular mother panel, and the rectangular panel is then cut, based on the scribe grooves, into a plurality of liquid crystal panels 102 (Step P25). Then, as shown in FIG. 19, the liquid crystal driving ICs 103a and 103b are mounted on each of the thus-liquid crystal panels 102 produced. The illumination device 106 is mounted as a back light, and the FPC 104 is connected to the panel 102 to complete the intended liquid crystal device 101 (Step P26).

The above-described method and apparatus to manufacture a liquid crystal device include the step of producing the color filter as described below. Each of the filter elements 3 of the color filter 1 shown in FIG. 6(a), for example, the color filter 118 shown in FIG. 20, is formed to the predetermined thickness by n times, for example, four times, of ink discharges from the plurality of the nozzles 27 belonging to the different nozzle groups, not by one main scanning with the ink jet head 22 (refer to FIG. 1) in the X direction. Therefore, if there are variations in the amounts of the ink discharged from the plurality of the nozzles 27, the occurrence of variations in thickness of the plurality of the filter elements 3 can be prevented, thereby making the distribution properties of light transmission of the color filter uniform in a plane. This results in the achievement of a clear color display without color irregularities in the liquid crystal device 101 shown in FIG. 20.

In the method and apparatus to manufacture a liquid crystal device of this embodiment, the filter elements 3 are formed by ink discharge from the ink jet head 22 using the ink jet apparatus 16 shown in FIG. 9. This reduces the need to run a complicated process, such as the photolithography process, and reduces the waste of materials.

Eighth Embodiment

Figure 21:
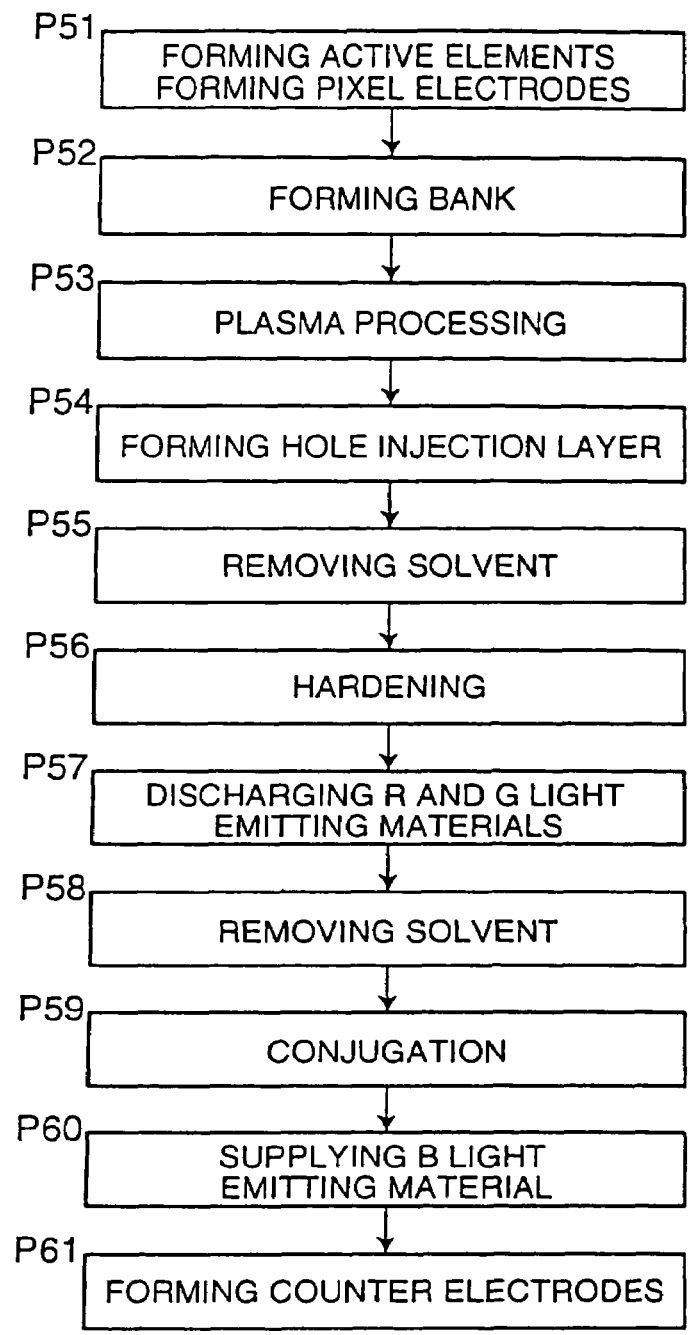
FIG. 21 is a flowchart showing the steps of a method of manufacturing an EL device according to an embodiment of the present invention.
Figure 22:
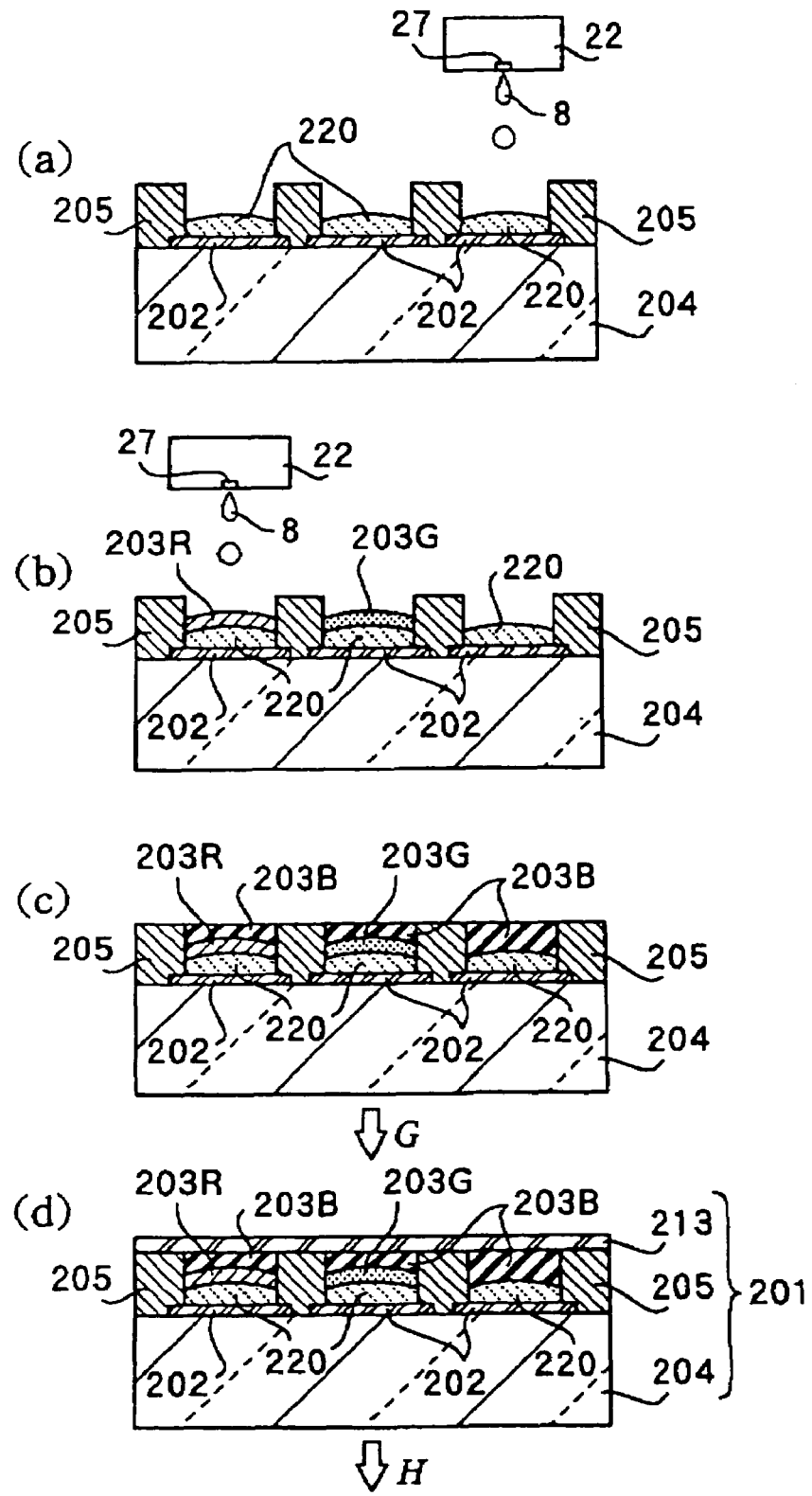
FIGS. 22(a)-22(d) are sectional views of the EL device corresponding to the steps shown in FIG. 21.
Figure 23:
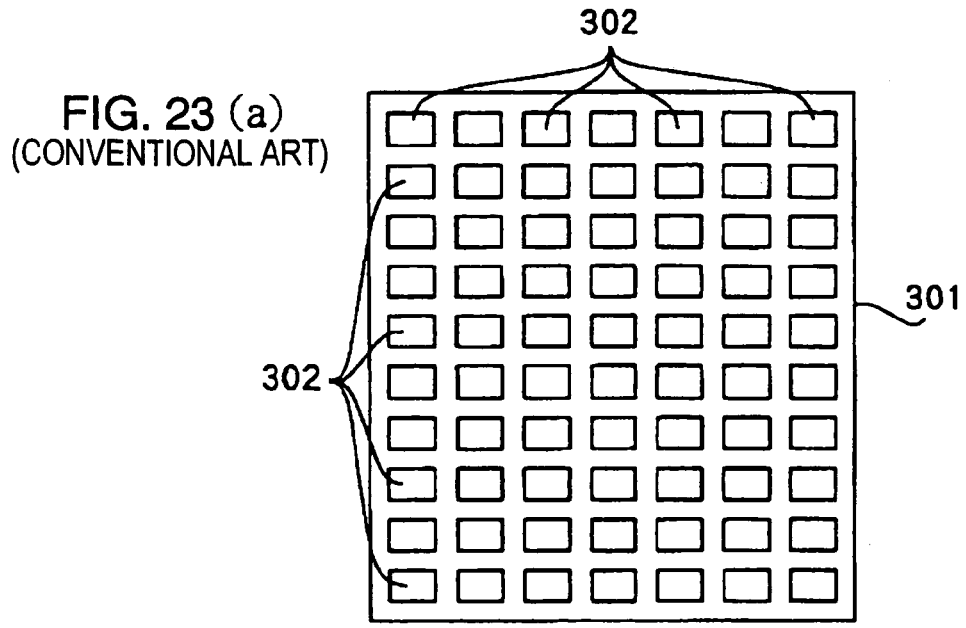
FIGS. 23(a)-23(c) are schematics showing an example of a conventional method of producing a color filter.
Figure 23:
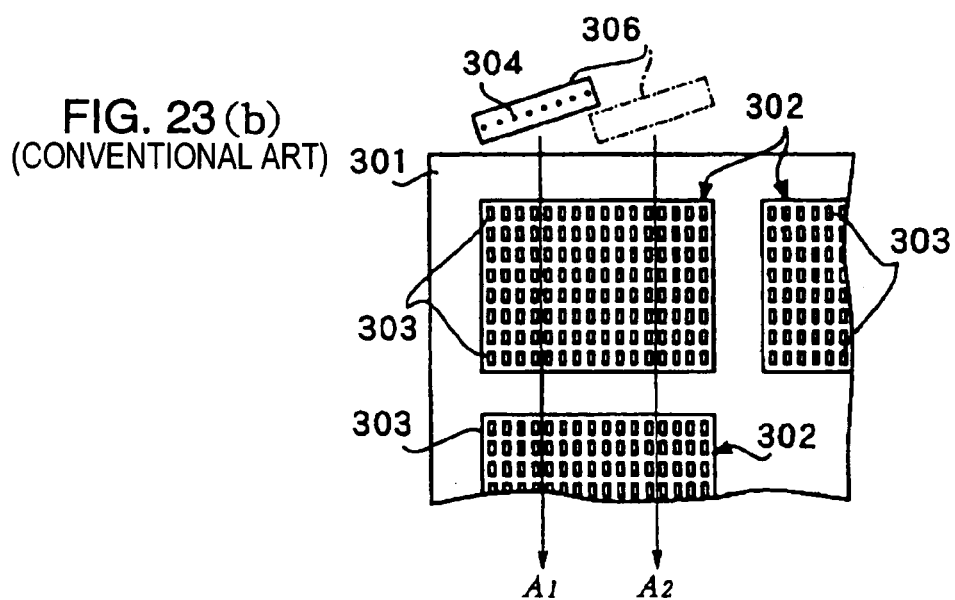
Figure 23:
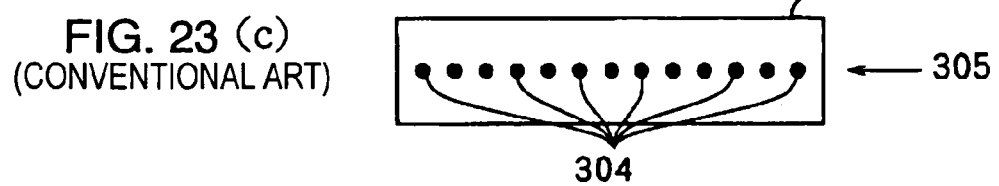

FIG. 21 shows a method of manufacturing an EL device according to an embodiment of the present invention. FIG. 22 shows the main steps of the manufacturing method and a main sectional structure of a finally resulted EL device. As shown in FIG. 22(d), an EL device 201 includes pixel electrodes 202 formed on a transparent substrate 204, a bank 205 formed in a lattice shape as viewed from the direction of arrow G to be located between the respective pixel electrodes 202, a hole injection layer 220 formed in the lattice-shaped recesses, a R color luminescent layer 203R, a G color luminescent layer 203G and a B color luminescent layer 203B which are formed in the lattice-shaped recesses in a predetermined arrangement such as a stripe arrangement as viewed from the direction of arrow G; and a counter electrode 213 formed on the luminescent layers.

When each of the pixel electrodes 202 is driven by a two-terminal active elements such as a TFD (Thin Film Diode) element or the like, the counter electrodes 213 are formed in stripes as viewed from the direction of arrow G. When each of the pixel electrodes 202 is driven by a three-terminal active element, such as a TFT (Thin Film Transistor) element or the like, the counter electrodes 213 are formed as a single planar electrode.

The area held between each of the pixel electrodes 202 and each of the counter electrodes 213 serves as a picture element pixel, and a unit of the three picture element pixels of R, G and B colors forms a pixel. By controlling a current flowing through each of the picture element pixels, a desired pixel of the plurality of picture element pixels is. selectively illuminated to display a desired full-color image in the direction of arrow H.

The EL device 201 is manufactured by, for example, the manufacturing method shown in FIG. 21.

In Step P51, as shown in FIG. 22(a), active elements, such as TFD element, TFT elements, or the like, are formed on the surface of the transparent substrate 204, and the pixel electrodes 202 are further formed. As the forming method, for example, photolithography methods, vacuum deposition methods, sputtering methods, pyrosol methods, or the like, can be used. The material of the pixel electrodes may include ITO (Indium Tin Oxide), tin oxide, a compound oxide of indium oxide and zinc oxide, or the like.

Next, in Step P52, as shown in FIG. 22(a), a partition, for example, the bank 205, is formed by a puttering method, for example, a photolithography method, to fill the spaces between the respective transparent electrodes 202. This can enhance contrast and prevent color mixing of luminescent materials and light leakage from the spaces between the pixels. Although the material of the bank 205 is not limited (as long as it has durability against a solvent of the EL materials), an organic material which can be fluorinated by fluorocarbon gas plasma treatment, for example, an acrylic resin, an epoxy resin, photosensitive polyimide, or the like, is preferably used.

Next, the substrate 204 is continuously treated with oxygen gas plasma and fluorocarbon gas plasma immediately before ink for the hole injection layer is coated (Step P53). This treatment can make a polyimide surface water-repellant and an ITO surface hydrophilic, thereby controlling wettability of the substrate for finely patterning ink jet droplets. As the device for generating a plasma, either a device that generates a plasma in vacuum or a device that generates a plasma in the air may be used in a same manner.

Next, in Step P54, as shown in FIG. 22(a), the ink for the hole injection layer is discharged from the ink jet head 22 of the ink jet apparatus 16 shown in FIG. 9 and coated in a pattern on the pixel electrodes 202. Specifically, the ink jet head controlling method uses the method shown in FIG. 1, 2, 3, 4 or 5. After coating, the solvent is removed under a vacuum (1 torr) at room temperature for 20 minutes (Step P55), and heat treatment is then performed in the air at 20° C. (on a hot plate) for 10 minutes to form the hole injection layers 220 incompatible with ink for luminescent layers (Step P56). The thickness of the hole injection layers 220 is 40 nm.

Next, in Step P57, as shown in FIG. 22(b), ink for the R color luminescent layer and ink for the G color luminescent layer are coated on the hole injection layer in each of the filter element areas by using an ink jet process. In this process, the ink for each luminescent layer is discharged from the ink jet head 22 of the ink jet apparatus 16, shown in FIG. 9, and the ink jet controlling method is performed according to the method shown in FIG. 1, 2, 3, 4 or 5. The ink jet process can easily finely pattern ink within a short time. The thickness can be changed by changing the solid content of an ink composition and the discharge amount.

After coating of the inks for luminescent layers, the solvent is removed under a vacuum (1 torr) at room temperature for 20 minutes (Step P58), and the inks are then conjugated by heat treatment in a nitrogen atmosphere at 150° C. for 4 hours to form the R color luminescent layer 203R and the G color luminescent layer 203G (Step P59). The thickness of the luminescent layers is 50 nm. The luminescent layers conjugated by heat treatment are insoluble in a solvent.

The hole injection layer 220 may be continuously treated with oxygen gas plasma, and fluorocarbon plasma before the luminescent layers are formed. This can form a fluorinated layer on the hole injection layer 220 to increase the efficiency of hole injection due to an increase in ionization potential, thereby providing an organic EL device having a high efficiency of light emission.

Next, in Step P60, as shown in FIG. 22(c), the B color luminescent layer 203B is formed on the R color luminescent layer 203R, the G color luminescent layer 203G and the hole injection layer 220 in each of the picture element pixels. This can not only form the primary colors R, G and B, but also remove the steps between the R color luminescent layers 203R and the G color luminescent layers 203G, and the bank 205 to planarize the surface. Therefore, short-circuiting between the upper and lower electrodes can be securely prevented. By controlling the thickness of the B color luminescent layers 203B, the B color luminescent layers function as electron injection transport layers in a laminated structure including the R color luminescent layers 203R and the G color luminescent layers 203G, thereby emitting no B color light.

As the method of forming the B color luminescent layers 203B as described above, for example, a general spin coating method as a wet method, or the same ink jet method, as that for forming the R color luminescent layers 203R and the G color luminescent layers 203G, can be used.

Then, in Step P61, as shown in FIG. 22(d), the counter electrodes 213 are formed to produce the intended EL device 201. When the counter electrodes 213 are formed as a planar electrode, the electrodes can be formed by a deposition method such as evaporation, sputtering, or the like, using, for example, Mg, Ag, Al, Li, or the like, as a material. When the counter electrodes 213 are formed as stripe electrodes, (37) the electrodes can be formed by patterning a deposited electrode layer by photolithography or the like.

The above-described method and apparatus to manufacture an EL device use the control method shown in FIG. 1, 2, 3, 4 or 5 as the ink jet head controlling method. The hole injection layers 220 and/or each of the luminescent layer 203R, 203G and 203B of R, G and B colors in one picture element pixel can be formed to the predetermined thickness by n times, for example, four times, of ink discharges from the plurality of the nozzles 27 belonging to the different nozzle groups, not by one main scanning with the ink jet head 22 (refer to FIG. 1) in the X direction. Therefore, if there are variations in the amounts of the ink discharged from the plurality of the nozzles 27, the occurrence of variations in thickness of the plurality of the picture element pixels can be prevented, thereby making (38) the distribution properties of light emission of the luminescent plane of the EL device uniform in a plane. This results in the achievement of a clear color display without color irregularities in the EL device 201 shown in FIG. 22(d).

In the method and apparatus used to manufacture an EL device of this embodiment, the picture element pixels of each of R, G and B colors are formed by ink discharge from the ink jet head 22 using the ink jet apparatus 16 shown in FIG. 9, thereby causing no need to conduct a complicated process, such as the use of the photolithography process, and no waste of materials.

Other Embodiments

Although the present invention is described above with reference to the preferred embodiments, the present invention is not limited to the embodiments, and various modifications can be made within the scope of the claim of the present invention.

For example, in the above-described embodiments, plural lines of the color filter formation areas 11 are set on the motherboard 12 as shown in FIG. 6(b), and the filter elements 3 are formed in each of the color filter formation areas 11 by using the ink jet head 22 smaller than the color filter formation areas 11. However, the present invention can be applied to the case in which the filter elements 3 are formed on a motherboard 12 by using the nozzle row 28 longer than one side of each of the color filter formation areas 11 and shorter than one side of the motherboard 12.

Although, in the embodiment shown in FIG. 1, plural lines of the color filter formation areas 11 are set on the motherboard 12, the present invention can be applied to the case in which one line of the color filter formation areas 11 is formed on the motherboard 12. Also, the present invention can be applied to the case in which only one color filter formation area 11, whose size is substantially the same as or extremely smaller than the motherboard 12, is set on the motherboard 12.

In the apparatus producing a color filter shown in FIGS. 9 and 10, the ink jet head 22 is moved in the X direction to perform main scanning of the substrate 12, and the substrate 12 is moved in the Y direction by the sub-scanning driving device 21 to perform sub-scanning of the substrate 12 with the ink jet head 22. However, in contrast, the substrate 12 may be moved in the Y direction to execute main scanning, and the ink jet head 22 may be moved in the X direction to execute sub-scanning.

Although each of the above-described embodiments uses an ink jet head having a structure in which ink is discharged by utilizing deflection of a piezoelectric element, an ink jet head having any desired structure can be used.

Although each of the above-described embodiments has a general construction in which the main scanning direction is perpendicular to the sub-scanning direction as an example, the relation between the main scanning direction and the sub-scanning direction is not limited to the perpendicular relation, and both directions may cross each other at any desired angle.

Various materials can be selected to be discharged according to the elements formed on an object, such as a substrate or the like. Besides the above-described ink and EL luminescent materials, for example, silica glass precursors, conductive materials such as metal compounds, dielectric materials, or semiconductor materials may be used.

Although the above embodiments relate to the method and apparatus to produce a color filter, the method and apparatus to manufacture a liquid crystal device, and the method and apparatus to manufacture an EL device as examples, the present invention is not limited to these examples, and can be used for all industrial techniques to finely pattern an object.

Examples of applications include the formation of various semiconductor devices (thin film transistors, thin film diodes, etc.), various wiring patterns, and insulating films, etc.

As the material to be discharged from a head, various materials can be selected according to the elements formed on an object, such as a substrate or the like. Besides the above-described ink and EL luminescent materials, other materials may be used, such as silica glass precursors, conductive materials such as metal compounds, dielectric materials, and semiconductor materials.

Although, in the above-described embodiments, the head is referred to as an "ink jet head" for the sake of convenience, the material to be discharged from the ink jet head is not limited to ink. Other materials may be discharged, including the EL luminescent materials, silica glass precursors, conductive materials such as metal compounds, dielectric materials, semiconductor materials, and the like. The liquid crystal device and EL device manufactured by the manufacturing method and apparatuses of the above embodiments can be mounted on the display sections of electronic devices, for example, cellular phones, portable computers, etc.

What is claimed is:

1. A method of manufacturing a color filter that includes filter elements arranged over a substrate, while scanning one of the substrate and a head relative to the other of the substrate and the head along a main scanning direction and while discharging a filter material from a plurality of nozzles in a nozzle row of the head to the substrate to draw the filter material in a predetermined position of a color filter formation area, the method comprising:

a first main scanning step of drawing by scanning multiple times, the first main canning step drawing a first crossing region, formed by the nozzle row and the substrate crossing by a first scanning, and a second crossing region, formed by the nozzle row and the substrate crossing by a second scanning, the first crossing region does not overlap the second crossing region; and a second main scanning step of drawing in the color filter formation area of the first main scanning step by scanning multiple times, the second main scanning step drawing a third crossing region, formed by the nozzle row and the substrate crossing by a third scanning, and a fourth crossing region, formed by the nozzle row and the substrate crossing by a fourth scanning, the third crossing region does not overlap the fourth scanning region, and during the second main scanning step at least a portion of the nozzle row overlaps with a drawing region of the first main scanning step, a boundary between the third crossing region and the fourth crossing region does not overlap with a boundary between the first crossing region and the second crossing region.

2. The method according to claim 1, the second main scanning step being performed multiple times so that a crossing region of the nozzle row and the substrate in each performance of the second main scanning step does not overlap with another crossing region of other performances of the second main scanning step.

3. A method of manufacturing a liquid crystal device that includes a pair of substrates, a liquid crystal disposed between the pair of substrates, and a color filter formed over one of the pair of the substrates, the method comprising:

manufacturing the color filter by the method according to claim 1.

4. An electronic apparatus, comprising:

a liquid crystal device manufactured by the method according to claim 3, the liquid crystal device being usable as a display section.

5. A method of manufacturing a color filter that includes filter elements arranged over a substrate, while scanning one of the substrate and a head relative to the other of the substrate and the head along a main scanning direction, the head having a nozzle row that includes a plurality of nozzles divided into a plurality of groups, the scanning being performed while discharging a filter material from the plurality of nozzles to the substrate to draw the filter material in a predetermined position of a color filter formation area, the method comprising:

a first main scanning step of drawing by scanning multiple times, the first main scanning step drawing a first crossing region, formed by the nozzle row including a first group of nozzles and the substrate crossing by a first scanning, and a second crossing region, formed by the nozzle row including the first group of nozzles and the substrate crossing by a second scanning, the first crossing region does not overlap the second crossing region; and a second main scanning step of drawing in the color filter formation area of the first main scanning step by scanning multiple times, the second main scanning step drawing a third crossing region, formed by the nozzle row and the substrate crossing by a third scanning, and a fourth crossing region, formed by the nozzle row and the substrate crossing by a fourth scanning, the third crossing region does not overlap the fourth scanning region and during the second main scanning step at least a portion of a group of nozzles other than the first group of nozzles overlaps with a drawing region of the first main scanning step, a boundary between the third crossing region and the fourth crossing region does not overlap with a boundary between the first crossing region and the second crossing region.

6. An apparatus for manufacturing a color filter that includes filter elements arranged over a substrate, the apparatus comprising:

a main scanning device that scans one of the substrate and a head relative to the other of the substrate and the head along a main scanning direction, the head having a nozzle row that includes a plurality of nozzles;

first main scanning means for drawing by scanning multiple times, the first main scanning means drawing a first crossing region, formed by the nozzle row and the substrate crossing by a first scanning, and a second crossing region, formed by the nozzle row and the substrate crossing by a second scanning, the first crossing region does not overlap the second crossing region; and second main scanning means for drawing in a color filter formation area of the first main scanning means by scanning multiple times, the second main scanning means drawing a third crossing region, formed by the nozzle row and the substrate crossing by a third scanning, and a fourth crossing region, formed by the nozzle row and the substrate crossing by a fourth scanning, the third crossing region does not overlap the fourth crossing region and during drawing by the second main scanning means at least a portion of the nozzle row overlaps with a drawing region of the first main scanning means, a boundary between the third crossing region and the fourth crossing region does not overlap with a boundary between the first crossing region and the second crossing region.

7. An apparatus for manufacturing a liquid crystal device that includes a pair of substrates, a liquid crystal disposed between the pair of substrates, and a color filter formed over one of the pair of substrates, the apparatus comprising:

the apparatus according to claim 6.

8. A method of manufacturing an EL device that includes an EL luminescent layer arranged over a substrate, while scanning one of the substrate and a head relative to the other of the substrate and the head along a main scanning direction, the head having a nozzle row that includes a plurality of nozzles, the scanning being performed while discharging an EL luminescent material from the plurality of nozzles to the substrate to draw the EL luminescent material in a predetermined position in a dot arrangement, the method comprising:

a first main scanning step of drawing by scanning multiple times, the first main scanning step drawing a first crossing region, formed by the nozzle row and the substrate crossing by a first scanning, and a second crossing region, formed by the nozzle row and the substrate crossings by a second scanning, the first crossing region does not overlap the second crossing region; and a second main scanning step of drawing in the predetermined position in a dot arrangement of the first main scanning step by scanning multiple times, the second main scanning step drawing a third crossing region, formed by the nozzle row and the substrate crossing by a third scanning, and a fourth crossing region, formed by the nozzle row and the substrate crossing by a fourth scanning, the third crossing region does not overlap the fourth crossing region and during the second main scanning step at least a portion of the nozzle row overlaps with a drawing region of the first main scanning step, a boundary between the third crossing region and the fourth crossing region does not overlap with a boundary between the first crossing region and the second crossing region.

9. The method according to claim 8, the second main scanning step being performed multiple times so that a crossing region of the nozzle row and the substrate in each performance of the second main scanning step does not overlap with another crossing region of other performances of the second main scanning step.

10. An electronic apparatus, comprising:

an EL device manufactured by the method according to claim 8, the EL device being usable as a display section.

11. A method of manufacturing an EL device that includes an EL luminescent layer arranged over a substrate, while scanning one of the substrate and a head relative to the other of the substrate and the head along a main scanning direction, the head having a nozzle row that includes a plurality of nozzles being divided into a plurality of groups, the scanning being performed while discharging an EL luminescent material from the plurality of nozzles to the substrate to draw the EL luminescent material in a predetermined position in a dot arrangement, the method comprising:

a first main scanning step of drawing by scanning multiple times, the first main scanning step drawing a first crossing region, formed by the nozzle row including a first group and the substrate crossing by a first scanning, and a second crossing region, formed by the nozzle row including the first group and the substrate crossing by a second scanning, the first crossing region does not overlap the second crossing region; and a second main scanning step of drawing in the predetermined position in a dot arrangement of the first main scanning step by scanning multiple times, the second main scanning step drawing a third crossing region, formed by the nozzle row and the substrate crossing by a third scanning, and a fourth crossing region, formed by the nozzle row and the substrate crossing by a fourth scanning, the third crossing region does not cross the fourth crossing region and during the second main scanning step at least a portion of a group of nozzles other than the first group of nozzles overlaps with a drawing region of the first main scanning step, a boundary between the third crossing region and the fourth crossing region does not overlap with a boundary between the first crossing region and the second crossing region.

12. An apparatus for manufacturing an EL device that includes an EL luminescent layer arranged over a substrate, the apparatus comprising:

a main scanning device that scans one of the substrate and a head relative to the other of the substrate and the head along a main scanning direction, the head having a nozzle row that includes a plurality of nozzles;

first main scanning means for drawing by scanning multiple times, the first main scanning means drawing a first crossing region, formed by the nozzle row and the substrate crossing by a first scanning, and a second crossing region, formed by the nozzle row and the substrate crossing by a second scanning, the first crossing region does not overlap the second crossing region; and second main scanning means for drawing in a predetermined position in a dot arrangement of the first main scanning means by scanning multiple times, the second main scanning means drawing a third crossing region, formed by the nozzle row and the substrate crossing by a third scanning, and a fourth crossing region formed by the nozzle row and the substrate crossing by a fourth scanning, the third crossing region does not overlap the fourth crossing region and during the drawing by the second main scanning means at least a portion of the nozzle row overlaps with a drawing region of the first main scanning means;

a boundary between the third crossing region and the fourth crossing region does not overlap with a boundary between the first crossing region and the second crossing region.

13. A method of discharging a material to an object, while scanning one of the object and a head relative to the other of the object and the head along a main scanning direction, the head having a nozzle row that includes a plurality of nozzles, the scanning being performed while discharging a material from the plurality nozzles to the object to draw the material in a predetermined position of the object, the method comprising:

a first main scanning step of drawing by scanning multiple times, the first main scanning step drawing a first crossing region, formed by the nozzle row and the object crossing by a first scanning, and a second crossing region, formed by the nozzle row and the object crossing by a second scanning, the first crossing region does not overlap the second crossing region; and a second main scanning step of drawing in the predetermined position of the first main scanning step by scanning multiple times, the second main scanning step drawing a third crossing region, formed by the nozzle row and the object crossing by a third scanning, and a fourth crossing region, formed by the nozzle row and the object crossing by a fourth scanning, the third crossing region does not overlap the fourth crossing region and during the second main scanning step at least a portion of the nozzle row overlaps with a drawing region of the first main scanning step, a boundary between the third crossing region and the fourth crossing region does not overlap with a boundary between the first crossing region and the second crossing region.

14. The method according to claim 13, the second main scanning step being performed multiple times so that a crossing region of the nozzle row and the substrate in each performance of the second main scanning step does not overlap with another crossing region of other performances of the second main scanning step.

15. An electronic apparatus, comprising:

a component manufactured by the method of discharging a material according to claim 13.

16. A method of discharging a material to an object, while scanning one of the object and a head relative to the other of the object and the head along a main scanning direction, the head having a nozzle row that includes a plurality of nozzles being divided into a plurality of groups, the scanning being performed while discharging a material from the plurality of nozzles to the object to draw the material in a predetermined position of the object, the method comprising:

a first main scanning step of drawing by scanning multiple times, the first main scanning step drawing a first crossing region, formed by the nozzle row including a first group of nozzles and the substrate crossing by a first scanning, and a second crossing region formed by the nozzle row including the first group of nozzles and the substrate crossing by a second scanning, the first crossing region does not overlap the second crossing region; and a second main scanning step of drawing in the predetermined position of the first main scanning step by scanning multiple times, the second main scanning step drawing a third crossing region, formed by the nozzle row and the object crossing by a third scanning, and a fourth crossing region, formed by the nozzle row and the object crossing by a fourth scanning, the third crossing region does not overlap the fourth crossing region and during the second main scanning step at least a portion of a group of nozzles other than a first group of nozzles overlaps with a drawing region of the first main scanning step, a boundary between the third crossing region and the fourth crossing region does not overlap with a boundary between the first crossing region and the second crossing region.

17. An apparatus for controlling a head that discharges a material to an object, the apparatus comprising:

a main scanning device that scans one of the object and a head relative to the other of the object and the head along a main scanning direction, the head having a nozzle row that includes a plurality of nozzles;

first main scanning means for drawing by scanning multiple times, the first main scanning means drawing a first crossing region, formed by the nozzle row and the object crossing by a first scanning, and a second crossing region formed by the nozzle row and the object crossing by a second scanning, the first crossing region does not overlap the second crossing region; and second main scanning means for drawing in a predetermined position of the first main scanning means by scanning multiple times, the second main scanning means drawing a third crossing region, formed by the nozzle row and the object crossing by a third scanning, and a fourth crossing region, formed by the nozzle row and the object crossing by a fourth scanning, the third crossing region does not overlap the fourth crossing region and during the drawing by the second main scanning means at least a portion of the nozzle row overlaps with a drawing region of the first main scanning means, a boundary between the third crossing region and the fourth crossing region does not overlap with a boundary between the first crossing region and the second crossing region.

* * * * *